United States Patent
Crane, Jr. et al.

[11] Patent Number: 6,141,869
[45] Date of Patent: *Nov. 7, 2000

[54] APPARATUS FOR AND METHOD OF MANUFACTURING A SEMICONDUCTOR DIE CARRIER

[75] Inventors: Stanford W. Crane, Jr., Boca Raton; Daniel Larcomb, Lake Worth; Lakshminarasimha Krishnapura, Delray Beach, all of Fla.

[73] Assignee: Silicon Bandwidth, Inc., Fremont, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/178,650

[22] Filed: Oct. 26, 1998

[51] Int. Cl.[7] .................................................. H01R 9/00
[52] U.S. Cl. ........................................................ 29/842
[58] Field of Search ................................. 29/889, 564.1, 29/845, 842

[56] References Cited

U.S. PATENT DOCUMENTS

| | | |
|---|---|---|
| 3,337,838 | 8/1967 | Damiano et al. . |
| 3,366,915 | 1/1968 | Miller . |
| 3,444,506 | 5/1969 | Wedekind . |
| 3,545,606 | 12/1970 | Bennett et al. ........................... 206/56 |
| 3,676,748 | 7/1972 | Kobayashi et al. . |
| 3,848,221 | 11/1974 | Lee Jr. . |
| 4,167,647 | 9/1979 | Saler ........................................ 174/52 |
| 4,274,700 | 6/1981 | Keglewitsch et al. . |
| 4,331,831 | 5/1982 | Ingram et al. ............................ 174/52 |
| 4,423,468 | 12/1983 | Gatto et al. ............................. 361/404 |
| 4,437,718 | 3/1984 | Selinko . |
| 4,616,406 | 10/1986 | Brown . |
| 4,649,229 | 3/1987 | Scherer et al. ......................... 29/884 X |
| 4,654,472 | 3/1987 | Goldfarb ................................... 174/52 |
| 4,660,069 | 4/1987 | Kochanski et al. . |
| 4,667,220 | 5/1987 | Lee et al. . |
| 4,675,472 | 6/1987 | Krumme et al. ......................... 174/52 |
| 4,698,663 | 10/1987 | Sugimoto et al. . |

(List continued on next page.)

FOREIGN PATENT DOCUMENTS

| | | |
|---|---|---|
| 0 155 044 | 9/1985 | European Pat. Off. . |
| 0 467 698 | 1/1992 | European Pat. Off. . |
| 60-16453 | 1/1985 | Japan . |
| 1-23560 | 1/1989 | Japan . |
| 1-205456 | 8/1989 | Japan . |
| 2-156456 | 9/1990 | Japan . |

(List continued on next page.)

OTHER PUBLICATIONS

AMP–ACS Interconnection Systems, *Products Information Bulletin*, 65188.

AMP Incorporated, *Product Guide*, Catalog 82750, Issued 6–91.

D.C.C. News, *Dimensional Circuits Corp. Awarded Two U.S. Patents*, Dimensional Circuits Corporation, Apr. 5, 1994.

(List continued on next page.)

*Primary Examiner*—Carl J. Arbes
*Attorney, Agent, or Firm*—Morgan, Lewis & Bockius LLP

[57] ABSTRACT

A lead insertion machine includes a substrate supply, a conductive lead supply, and an lead insertion mechanism. The conductive leads are inserted into lead passages formed in side walls of the substrate. Also disclosed is a method of manufacturing a semiconductor die carrier including the steps of forming a plurality of conductive leads, forming a substrate for holding a semiconductor die, the substrate having a plurality of insulative side walls defining an exterior surface of said substrate, each of the side walls having a plurality of lead passages formed therethrough, and simultaneously inserting at least one of the conductive leads into the lead passage of one of the side walls for retention therein and at least one other of the conductive leads into the lead passage of another of the side walls for retention therein.

29 Claims, 38 Drawing Sheets

U.S. PATENT DOCUMENTS

| | | | |
|---|---|---|---|
| 4,705,917 | 11/1987 | Gates Jr. et al. | 174/52 |
| 4,724,472 | 2/1988 | Sugimoto . | |
| 4,734,042 | 3/1988 | Martens et al. | 439/62 |
| 4,879,808 | 11/1989 | Smith et al. | 29/845 |
| 4,928,378 | 5/1990 | Smith et al. | 29/564.1 X |
| 4,943,846 | 7/1990 | Shirling . | |
| 4,989,318 | 2/1991 | Utunomiya et al. | 29/843 |
| 4,991,291 | 2/1991 | Koepke et al. | 29/884 |
| 4,997,376 | 3/1991 | Buck et al. | 439/59 |
| 5,008,734 | 4/1991 | Dutta et al. . | |
| 5,015,207 | 5/1991 | Koepke | 439/886 |
| 5,022,144 | 6/1991 | Hingorany | 29/854 |
| 5,037,311 | 8/1991 | Frankeny et al. | 439/66 |
| 5,049,974 | 9/1991 | Nelson et al. . | |
| 5,071,363 | 12/1991 | Reylek et al. | 439/291 |
| 5,081,563 | 1/1992 | Feng et al. | 361/414 |
| 5,091,772 | 2/1992 | Kohara et al. | 174/261 |
| 5,117,069 | 5/1992 | Higgins, III . | |
| 5,138,438 | 8/1992 | Masayuki et al. . | |
| 5,182,853 | 2/1993 | Kobayashi et al. | 361/412 |
| 5,259,111 | 11/1993 | Watanabe | 29/885 |
| 5,281,151 | 1/1994 | Arima et al. | 439/68 |
| 5,285,104 | 2/1994 | Kondo et al. | 257/666 |
| 5,309,024 | 5/1994 | Hirano | 257/773 |
| 5,326,936 | 7/1994 | Taniuchi et al. | 174/260 |
| 5,330,372 | 7/1994 | Pope et al. | 439/692 |
| 5,331,514 | 7/1994 | Kuroda | 361/760 |
| 5,344,343 | 9/1994 | Seidler | 439/876 |
| 5,347,429 | 9/1994 | Kohno et al. | 361/813 |
| 5,351,393 | 10/1994 | Gregoire | 29/835 |
| 5,376,825 | 12/1994 | Tukamoto et al. | 257/685 |
| 5,403,784 | 4/1995 | Hashemi et al. . | |
| 5,422,514 | 6/1995 | Griswold et al. | 361/679 |
| 5,428,505 | 6/1995 | Sakemi et al. | 257/777 |
| 5,543,586 | 8/1996 | Crane, Jr et al. | 174/262 |
| 5,575,688 | 11/1996 | Crane, Jr. | 439/660 |
| 5,593,322 | 1/1997 | Swamy et al. | 439/660 |
| 5,634,821 | 6/1997 | Crane, Jr. | 439/660 |
| 5,641,309 | 6/1997 | Crane, Jr. | 439/660 |
| 5,659,953 | 8/1997 | Crane, Jr. et al. | 29/843 |
| 5,683,272 | 11/1997 | Abe | 439/747 |
| 5,696,027 | 12/1997 | Crane et al. . | |

FOREIGN PATENT DOCUMENTS

| | | |
|---|---|---|
| 4-72750 | 3/1992 | Japan . |
| 4147660 | 5/1992 | Japan . |
| 2 091 036 | 7/1982 | United Kingdom . |
| 2 196 178 | 4/1988 | United Kingdom . |

OTHER PUBLICATIONS

Du Pont Electronics, Du Pont Connector Systems, Product Catalog A,.

Du Pont Electronics, Du Pont Connector Systems, Berg Electronics, Product Catalog A, "Shrouded Headers High–Density, Through–Mount Vertical Rib–Cage™II Through–Mount Shrouded Headers" and "PCB Mounted Receptacle Assemblies: Micropax™Board–to–Board Interconnect System".

S. M. Jensen, T. J. Kopl, D. L. Thurber, R. L. Weiss and G. L. Williams, "Card–to–Board Planar Connector System", IBM Technical Disclosure Bulletin, vol. 12, No. 9, Feb. 1970.

V. Y. Doo, "Liquid Metal Multihead Connector", IBM Technical Disclosure Bulletin, vol. 20, No. 11B, Apr. 1978.

IBM Corp. Technical Disclosure Bulletin, Plane Electrical Enhancement, vol. 32, No. 10A, Mar. 1990.

Intel Corporation, Packaging.

Robert Barnhouse, *Connection Technology*, Bifurcated Through–Hole Technology —An Innovative Solution to Circuit Density, Feb. 1992.

Rao. R. Tummala, Microelectronics Packaging Handbook, Foreword, Chapters 11 (Package–To–Board Interconnections, and 12 (Printed–Circuit Board Packaging), New York, Van Nostrand Reinhold, ©1989.

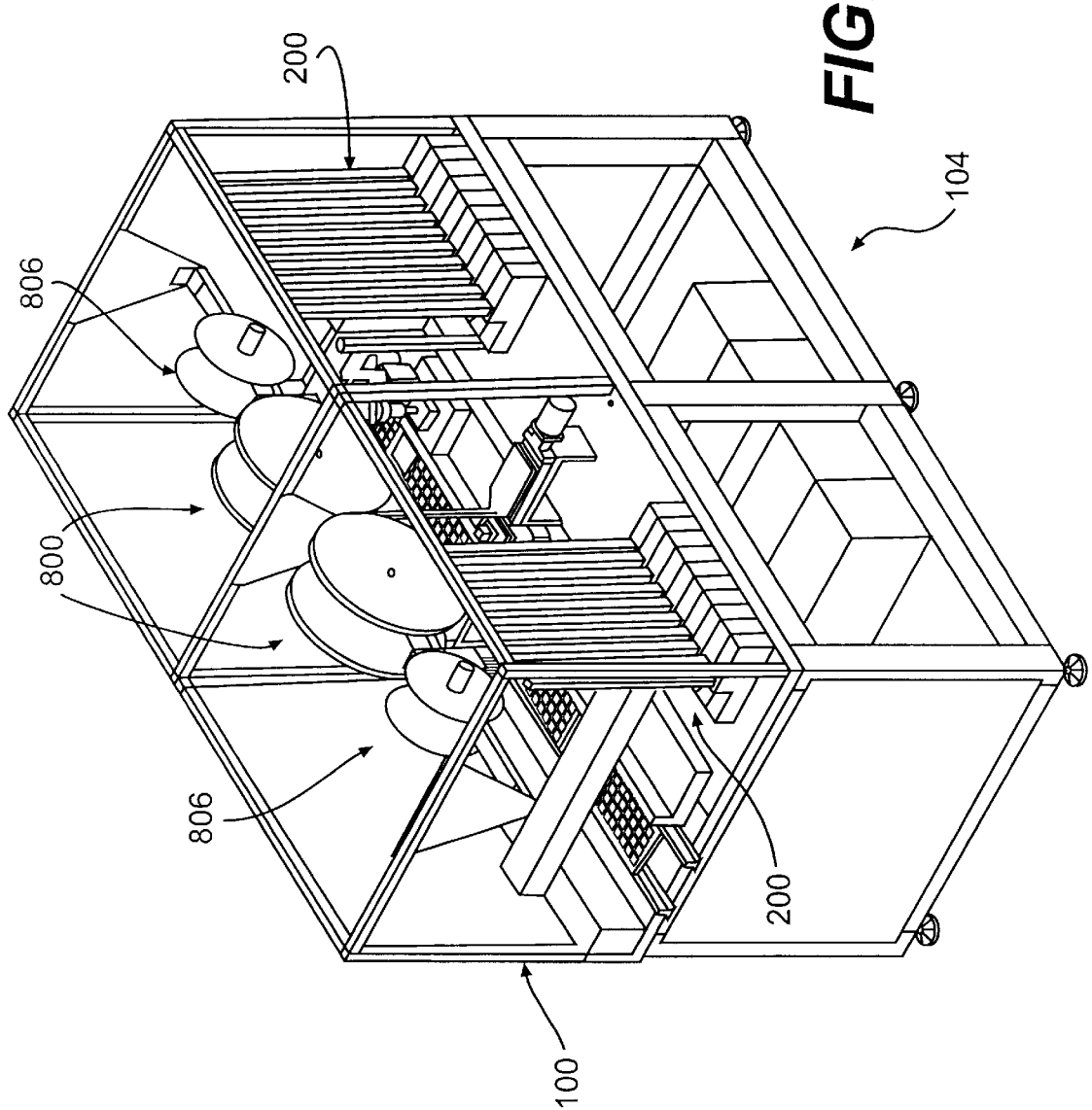

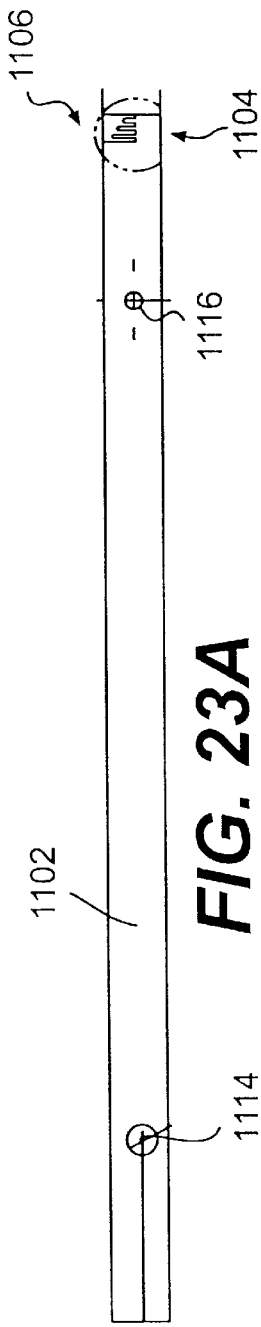
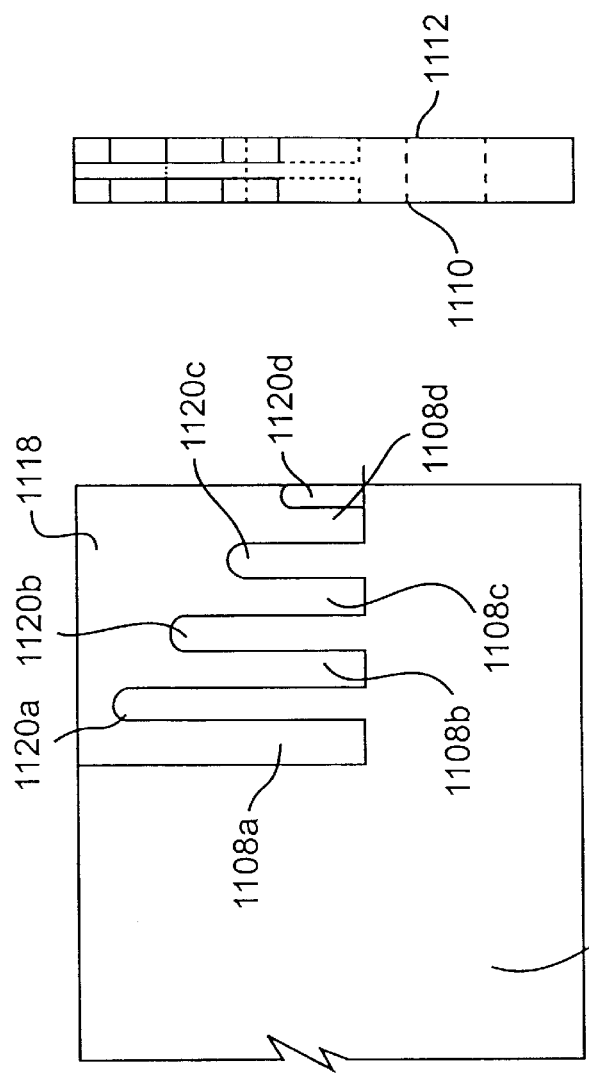
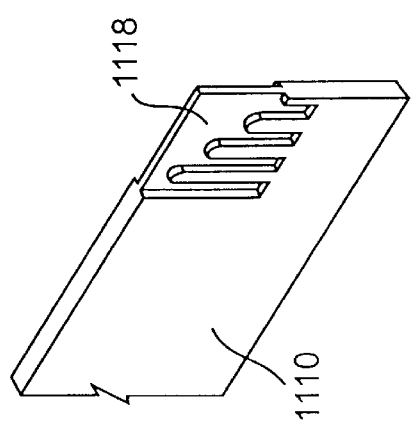
FIG. 23A
FIG. 23B
FIG. 23C
FIG. 23D

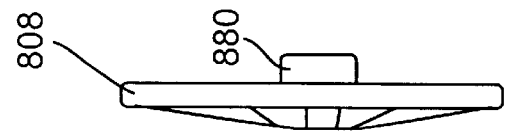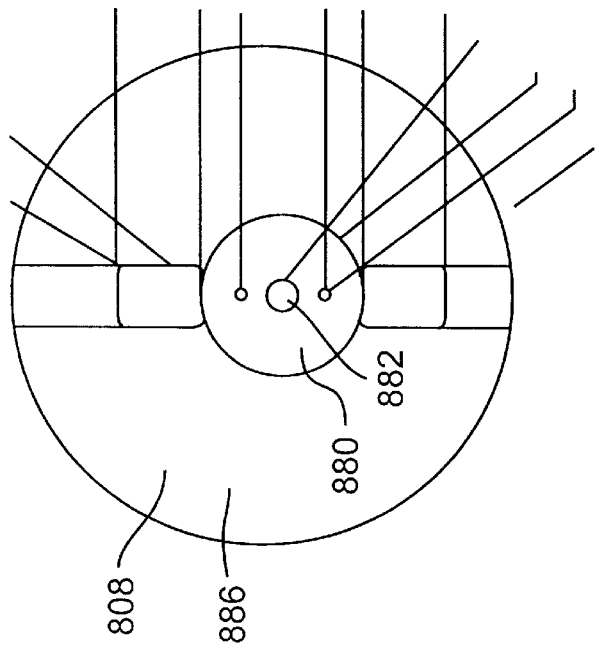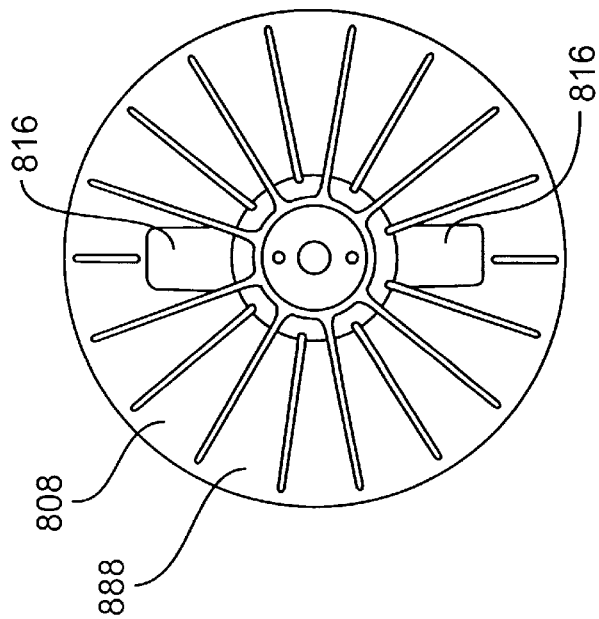

APPARATUS FOR AND METHOD OF MANUFACTURING A SEMICONDUCTOR DIE CARRIER

RELATED PATENTS/APPLICATIONS

This application is related in subject matter to several patents/applications which are commonly owned by the Assignee of this application. These applications are: U.S. application Ser. No. 08/970,379, entitled "MULTI-CHIP MODULE HAVING INTERCONNECT DIES", filed Nov. 14, 1997; U.S. application Ser. No. 08/208,586, entitled "PREFABRICATED SEMICONDUCTOR CHIP CARRIER", filed Mar. 11, 1994; and U.S. Pat. No. 5,819,403, entitled "METHOD OF MANUFACTURING A SEMICONDUCTOR CHIP CARRIER", each of which are expressly incorporated by reference herein.

BACKGROUND OF THE INVENTION

1. Field of the Invention

The present invention relates to an apparatus and method for manufacturing an electrical component and, more particularly, a semiconductor die carrier, and to an apparatus and method for inserting conductive leads into side walls of a substrate that holds a semiconductor die.

2. Description of the Prior Art

Semiconductor dies have numerous applications in the world today. The dies are usually supported in a housing or carrier (also known as a "package") that protects the die and facilitates the connection of the die to a substrate or a board, depending on the application. The carriers often include conductive leads that establish an electrical connection between the semiconductor die and a substrate or board.

Semiconductor die carriers are typically manufactured by molding a plastic housing around a lead frame. The lead frame connects individual leads to maintain their position during molding. The assignee has adopted a different approach to simplify manufacture, improve electrical performance, and reduce cost. U.S. Pat. No. 5,819,403, for example, describes inserting preformed leads into holes through the carrier housing. As more conductive leads are required for each semiconductor die carrier, the manufacturing process becomes increasingly repetitive and time consuming. The mounting of multiple conductive leads to a single side of a die carrier requires many iterations. Manufacturing time is critical to the profitability of a manufacturing process, especially when that process produces a low-cost, high-volume product.

Conventional lead insertion machines are configured to process a "single size package," i.e., a specific carrier with specific dimensions and containing a specific number of leads. Usually, a different machine is required to accommodate different sized and shaped packages. Further, conventional machines are limited in their adjustability regarding the depth of lead insertion and the spacing between leads along the side walls of the package. In addition, such machines use a bandolier system to supply leads for insertion into a package. In this system, individual leads are carried in a belt called a bandolier. In a bandolier system, the risk of bending or damaging leads either before or during insertion into both the bandolier or the package is very high. Another conventional method of inserting leads involves the manual insertion of the leads. Obviously, this method takes an inordinate amount of time and the leads may be damaged during handling or insertion.

Accordingly, there exists a need in the art to provide an economical method of manufacturing a semiconductor die carrier. Also, a need exists for an apparatus that can be used to economically manufacture different sizes and shapes of semiconductor die carriers or other electrical components with external leads. Also, there is a need for an apparatus that can supply and insert leads so that they are not damaged during the insertion process.

SUMMARY OF THE INVENTION

The present invention has been made in view of the above circumstances and has as an object to provide an apparatus for manufacturing an electrical component with external leads such as like a semiconductor die carrier.

A further object of the present invention is to provide an apparatus for inserting conductive leads into lead passages in a substrate, such as a package for holding a semiconductor die.

A further object of the invention is to provide an apparatus for inserting leads into lead passages in a side wall of a substrate.

A further object of the invention is to provide an apparatus for simultaneously inserting leads into lead passages in at least two side walls of a substrate.

A further object of the invention is to provide an apparatus for inserting conductive leads into vertically-spaced rows on a side wall of a substrate.

A further object of the invention is to provide an apparatus for simultaneously inserting conductive leads into vertically-spaced rows on at least two side walls of a substrate.

A further object of the invention is to provide an apparatus for inserting conductive leads into different sized and shaped substrates with a minimum amount of adjustment of the apparatus.

A further object of the invention is to provide an apparatus for inserting conductive leads that has a wide range of adjustability regarding the depth of lead insertion and spacing between the leads.

A further object of the invention is to provide an apparatus for inserting conductive leads that utilizes feedback from photographic, optical, and electronic signals to accurately insert leads into a substrate.

A further object of the invention is to provide an apparatus for inserting conductive leads that includes multiple lead supplies and multiple substrate supplies to permit the apparatus to run operations in parallel and eliminate down time with minimal operator supervision.

A further object of the invention is to provide an apparatus for inserting leads that includes a system for recycling scrap material produced during the lead insertion process.

A further object of the invention is to provide an apparatus that can easily insert a varying number of leads into a substrate.

A further object of the invention is to provide a method of economically manufacturing an electrical component with external leads, such as a semiconductor die carrier.

A further object of the invention is to provide a method for simultaneously inserting a conductive lead into a lead passage of one side wall of a substrate and another conductive lead into a lead passage of another side wall of the same substrate.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention includes a method of manufacturing a semiconductor die carrier, comprising the steps of forming a plurality of conductive leads, forming a substrate for holding a semiconductor die, the substrate having a plurality of insulative side walls defining an exterior surface of the substrate and each of the side walls has a plurality of lead passages formed therethrough, and simultaneously inserting at least one of the conductive leads into a lead passage of one side wall of the substrate for retention therein and at least one other of the conductive leads into a lead passage of another side wall of the substrate for retention therein.

In an embodiment, the lead passages are sized so as to frictionally retain the conductive leads and may be formed through each side wall in multiple vertically-spaced rows. Also, the lead passages through each side wall may be vertically aligned, alternatively, staggered with respect to each other. The conductive leads may be substantially L-shaped. The leads inserted into differing ones of the vertically-spaced rows may be of differing length.

The step of forming the substantially L-shaped conductive leads includes the step of punching the substantially L-shaped conductive leads from metal.

The step of inserting the conductive leads includes inserting a conductive lead into a lead passage in a vertically-spaced row on one of the side walls for retention therein.

The step of simultaneously inserting the conductive leads includes simultaneously inserting any number of the conductive leads into the lead passages in any number of the vertically-spaced rows on one of the side walls for retention therein and others of the conductive leads into the lead passages in any number of the vertically-spaced rows on another of the side walls for retention therein.

The invention further includes a method of manufacturing a semiconductor die carrier, comprising the steps of forming a plurality of substantially L-shaped conductive leads, forming a substrate for holding a semiconductor die, the substrate having a plurality of insulative side walls defining an exterior surface of the substrate and each of the side walls has a plurality of lead passages formed therethrough in multiple, vertically-spaced rows, and simultaneously inserting some of the conductive leads into lead passages of one side wall of the substrate for retention therein and some of the conductive leads into lead passages of another side wall of the substrate for retention therein.

The invention further includes an apparatus for inserting conductive leads into a substrate for holding a semiconductor die. The substrate has a plurality of insulative side walls that define an exterior surface of the substrate and each side wall has a plurality of lead passages formed therethrough. The apparatus includes a means for supplying a plurality of conductive leads for insertion into the substrate, a means for supplying individual substrates to have conductive leads inserted therein, and a means for simultaneously inserting leads into the lead passages in at least two of the side walls of the substrate.

The lead passages in each side wall of the substrate may occur in multiple, vertically-spaced rows. The means for supplying a plurality of conductive leads includes means for suppling a plurality of substantially L-shaped conductive leads. The means for simultaneously inserting the leads includes means for simultaneously inserting some of the conductive leads into the lead passages in any number of the vertically-spaced rows on at least two of the side walls of the substrate for retention therein.

The invention further includes an apparatus for inserting conductive leads into a substrate for holding a semiconductor die. The substrate has a plurality of insulative side walls that define an exterior surface of the substrate and each of the side walls has a plurality of lead passages formed therethrough in multiple, vertically-spaced rows. The apparatus includes means for supplying a plurality of L-shaped conductive leads for insertion into the substrate, means for supplying individual substrates to have conductive leads inserted therein, and means for simultaneously inserting L-shaped conductive leads into the lead passages in at least two of the vertically-spaced rows on one of the side walls of the substrate.

The means for simultaneously inserting the leads further includes means for simultaneously inserting some of the L-shaped conductive leads into the lead passages in any number of the vertically-spaced rows on one of the side walls for retention therein. The L-shaped leads inserted into differing vertically-spaced rows may be of differing length or shape.

The invention further includes an apparatus for inserting conductive leads into a substrate for holding a semiconductor die, with the substrate having a plurality of insulative side walls defining an exterior surface of said substrate and each of the side walls having a plurality of lead passages formed therethrough. The apparatus includes a first feed mechanism for feeding multiple supply lines of conductive leads to the apparatus, each of the supply lines comprising a plurality of conductive leads mounted on a transport medium, and could include a second feed mechanism for feeding individual substrates to the apparatus for conductive lead insertion. The apparatus further includes a mandrel for holding an individual substrate during the insertion of the leads, a product carriage for receiving the substrates after insertion of the leads, and a lead insertion mechanism.

The lead insertion mechanism receives conductive leads from the first feed mechanism, and the in at least two of the side walls of the substrate.

The apparatus further includes a punch mechanism for removing individual leads from the transport medium and supplying the removed leads to the lead insertion mechanism, and a robot arm adapted to move individual substrates from the second feed mechanism to the mandrel prior to insertion of the leads, and from the mandrel to the product carriage after insertion of the leads.

The conductive leads supplied by the first feed mechanism may be L-shaped conductive leads. Preferably, the transport medium includes either a substantially continuous strip or a substantially continuous tape containing the plurality of conductive leads and the second feed mechanism includes a plurality of tubes with a plurality of substrates for holding a semiconductor die housed therein, each of the tubes having an apparatus for ejecting an individual substrate mounted thereon.

The lead passages in each side wall of the substrate may occur in multiple, vertically-spaced rows. The conductive lead insertion mechanism is further adapted to simultaneously insert some of the conductive leads into the lead passages in any number of the vertically-spaced rows on at least one of the side walls for retention therein. The L-shaped leads inserted into differing vertically-spaced rows may of differing length.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiment(s) of the invention and together with the description, serve to explain the principles of the invention.

FIGS. 1A–B are front and rear perspective views of the lead insertion machine according to the present invention;

FIGS. 23A–D are side, enlarged side, end, and perspective views of the lead pusher according to the present invention;

FIGS. 35A–C are front, rear, and side views of the take-up reel according to the present invention.

DESCRIPTION OF THE PREFERRED EMBODIMENT

Reference will now be made in detail to the present exemplary embodiment(s) of the invention illustrated in the accompanying drawings. Wherever possible, the same reference numbers will be used throughout the drawings to refer to the same or like parts.

Figure 1A:
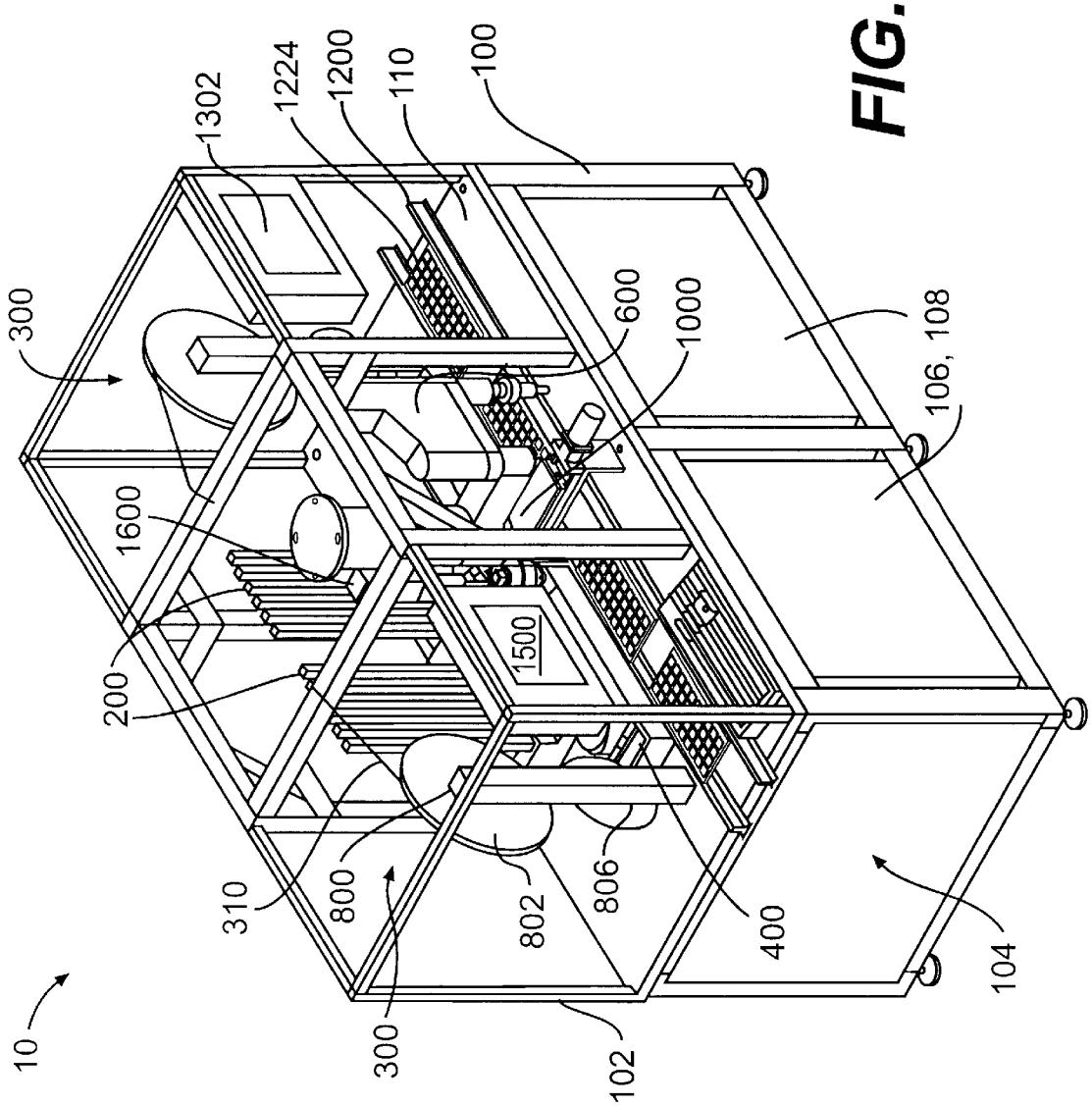

The apparatus in accordance with an embodiment of the invention includes a first feed mechanism for feeding multiple supply lines of conductive leads to the apparatus, each of the supply lines comprising a plurality of conductive leads mounted on a transport medium, and a second feed mechanism for feeding individual substrates to the apparatus for conductive lead insertion. The apparatus further includes a mandrel for holding an individual substrate during the insertion of the leads, a product carriage for receiving the substrates after insertion of the leads, and a conductive lead insertion mechanism. The lead insertion mechanism receives conductive leads from the first feed mechanism, and the lead insertion mechanism is adapted to simultaneously insert multiple leads into the lead passages in at least two of the side walls of the substrate. FIGS. 1A and 1B illustrate an example of a lead insertion machine 10 according to the invention.

The lead insertion machine 10 includes a substrate feeder assembly 200, a lead supply line 300, and a lead insertion mechanism 1000. Substrate feeder assembly 200 contains at least one substrate 250 (i.e. an electrical component housing, such as a semiconductor die carrier) and may contain thousands of substrates.

Figure 16:
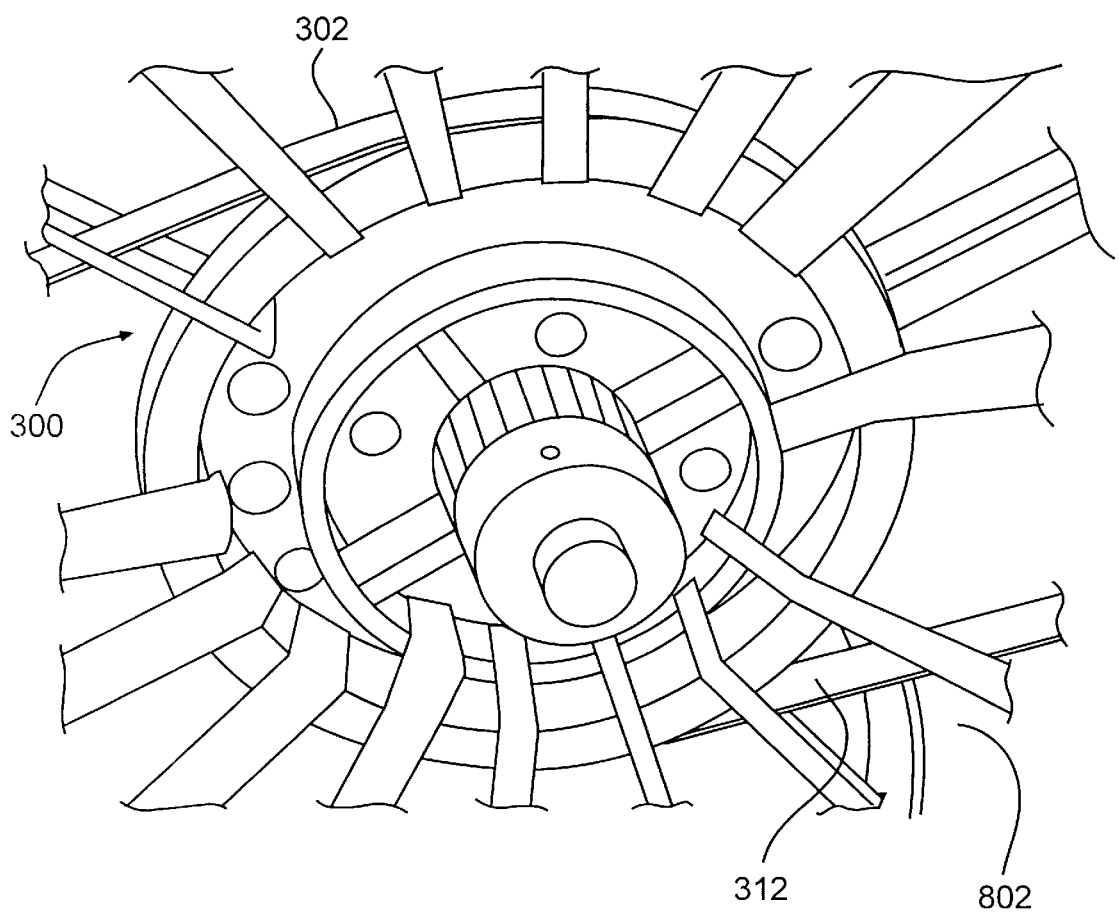
FIG. 16 is a side view of a reel of the dereeler assembly according to the present invention.

Lead supply line 300 includes a supply of conductive leads 310 that are supported by a backing tape or interleaf 312 (see FIG. 16 for interleaf 312). Referring back to FIG. 1A, the lead supply line 300 is directed to a lead insertion mechanism 1000 that inserts the conductive leads 310 into the substrate 250. The lead insertion machine 10 may include two lead supply lines 300, each of which is wound onto a reel 802 in a dereeler assembly 800. Take-up reel assembly 806 includes a reel 808 onto which the interleaf 312 is wound as the lead supply line 300 is fed to the lead insertion mechanism 1000. Note that FIG. 1B is a rear perspective view of the lead insertion machine 10 and shows a differing embodiment of the dereeler assembly 800 and the take-up reel assembly 806. These differing embodiments illustrate that the dereeler assembly 800 and the take-up reel assembly 806 may be located anywhere within proximity to the lead insertion mechanism 1000, for example, dependent upon specific spatial requirements.

An embodiment of the lead insertion machine includes a mechanism for feeding individual substrates to the apparatus for conductive lead insertion. An example of such a mechanism is shown in FIGS. 1A and 1B. A robot assembly 600 may be used for moving a substrate 250 from the substrate feeder assembly 200 to a substrate moving assembly 400. The substrate 250 is moved along the substrate moving assembly 400 to a location near the lead insertion mechanism 1000 so that leads may be inserted therein. Once the desired number of leads 310 have been inserted into the substrate 250, the robot assembly 600 moves the substrate 250 to a product carriage 1224 on a conveyor assembly 1200. Robot assembly 600 is controlled by responses received from a vision guidance assembly 1600.

An embodiment of the lead insertion machine 10 also includes a frame 100 that supports the various assemblies. Referring to FIG. 1A, frame 100 includes a table 110, a safety enclosure 102, and an electrical enclosure 104. Safety enclosure 102 is located above the table 110 and surrounds the various lead inserting assemblies. Safety enclosure 102 includes shields (not shown—removed for clarity) located between adjacent horizontal and vertical members of the frame 100. Each shield is attached on one side to a vertical member and functions as an access door for the operator to access the components of the lead insertion machine 10. Preferably, each shield is made from polycarbonate (e.g., LEXAN™) and is transparent to permit an operator to watch the process. Additionally, the shields provide protection for the operator during the manufacturing process.

Enclosure 104 is located beneath the table 110. Electrical components of the lead insertion machine may be housed therein. A scrap bin for recyclable material left over from the lead insertion process may also housed within enclosure 104. As shown in FIG. 1A, doors 106, 108 close the front of the electrical enclosure 104 and protect its contents from damage.

An embodiment of a lead insertion machine includes a computer aided manufacturing software control assembly. An example of such an assembly that utilizes a touch screen 1302 is shown in FIG. 1A. With such a system, the operator may select operating conditions for the manufacturing process by using the touch screen 1302 and machine set-up and run menus (not shown) displayed on the touch screen 1302. The operating conditions may be evaluated during the process by watching a video monitor 1500 on the lead insertion machine 10.

Figure 2:
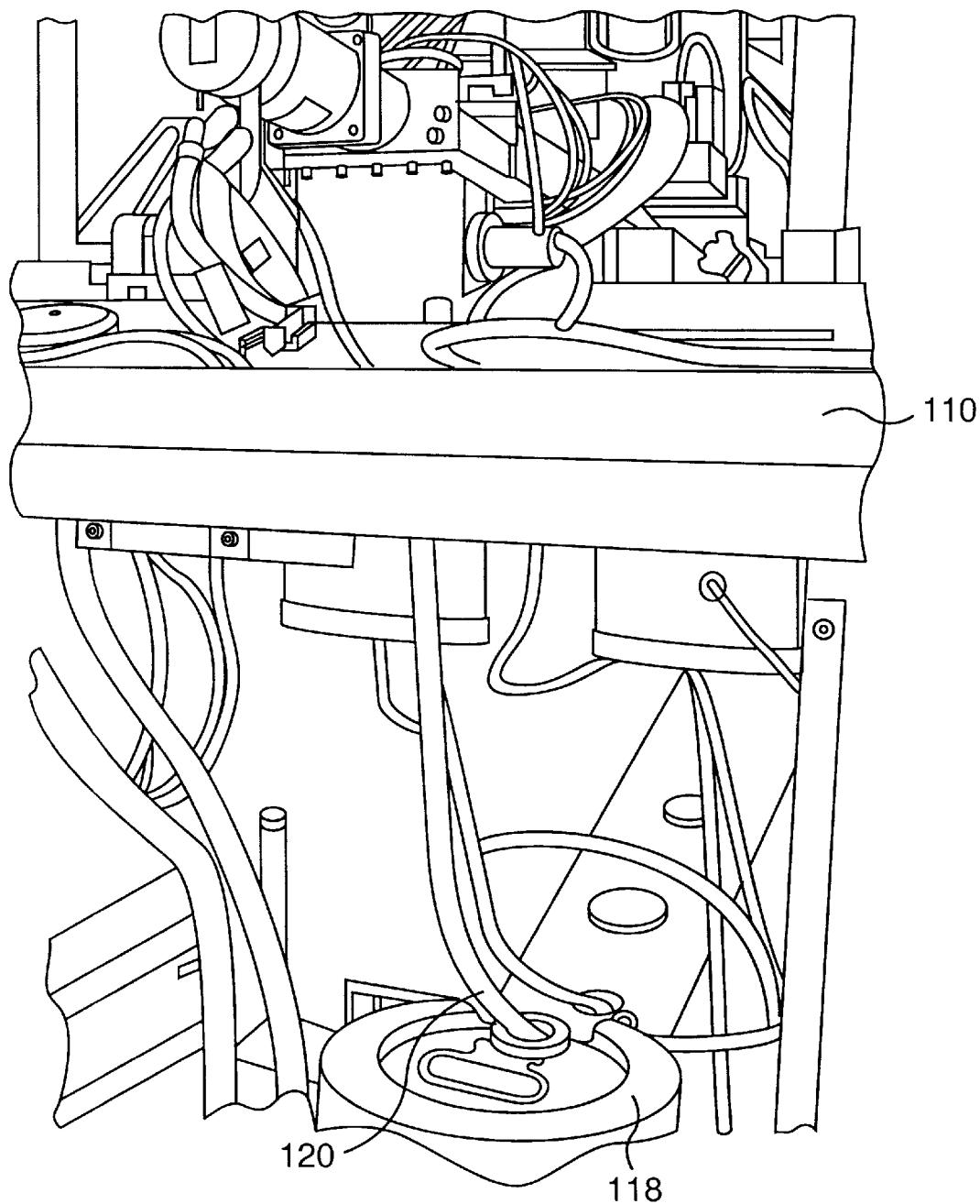
FIG. 2 is a view of the enclosure under the lead insertion machine of FIG. 1.
Figure 32:
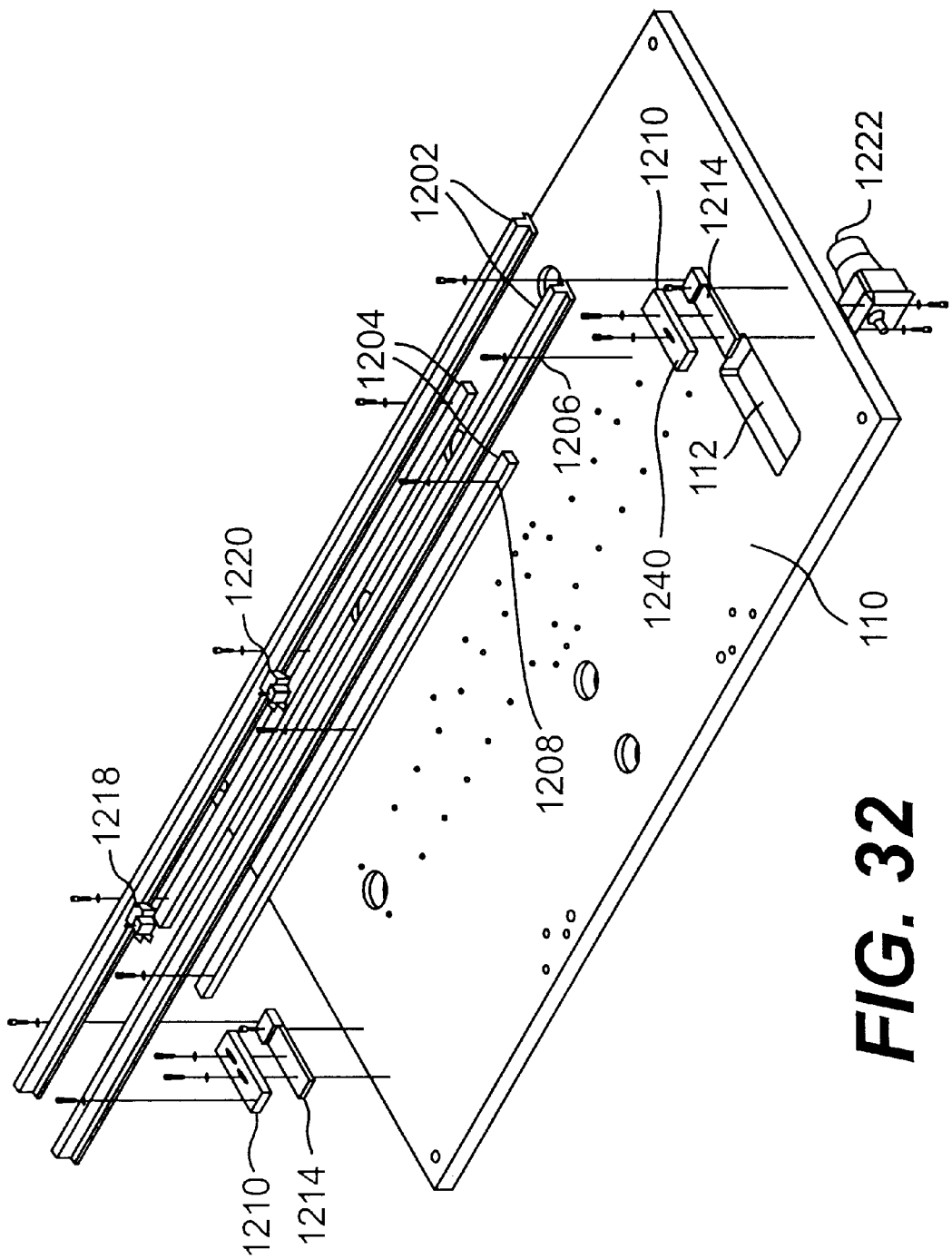

As discussed above, an embodiment of the lead insertion machine may also include a scrap bin 118 located beneath table 110 for collecting scrap parts from the manufacturing process (see FIG. 2). A scrap opening 112 is formed in table 110 as shown in FIG. 32. Scrap pieces pass through scrap opening 112 into tube 120. Preferably, tube 120 is under a vacuum and draws the scrap pieces into the scrap bin 118. When the scrap bin 118 is full, the scrap pieces can be recycled for future processes.

Figure 3:
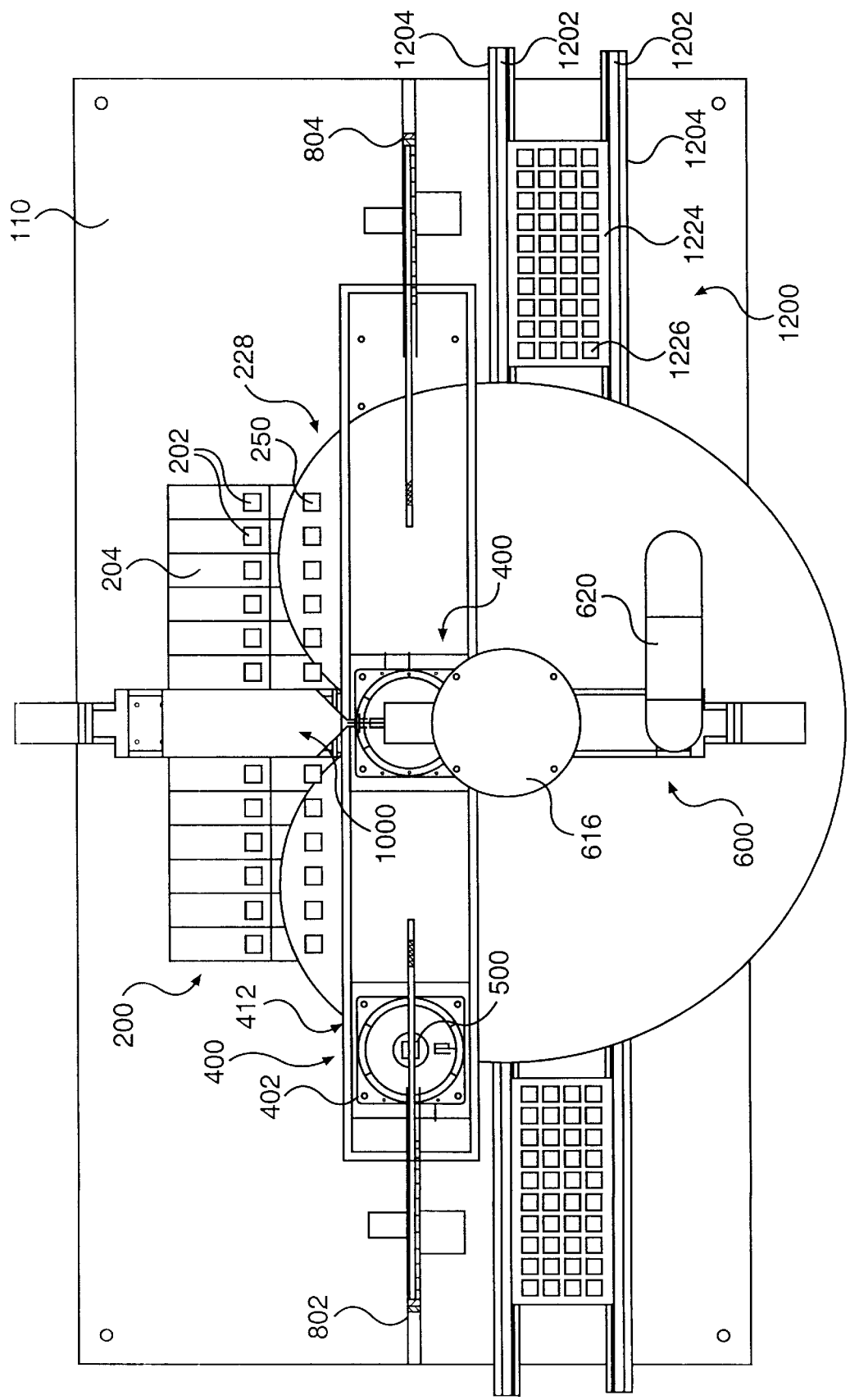
FIG. 3 is a top view of the lead insertion machine of FIG. 1.

A top view of a lead insertion machine in accordance with an embodiment of the invention is shown in FIG. 3. Preferably, the lead insertion machine 10 includes two substrate feeder assemblies 200. Each substrate feeder assembly 200 comprises tubes 202 into which substrates 250 are stacked. While six tubes 202 are shown for each substrate feeder assembly 200, the number of tubes 202 may be varied as desired. Alternatively, any type of continuous feed apparatus for supplying substrates may be utilized.

Figure 4:
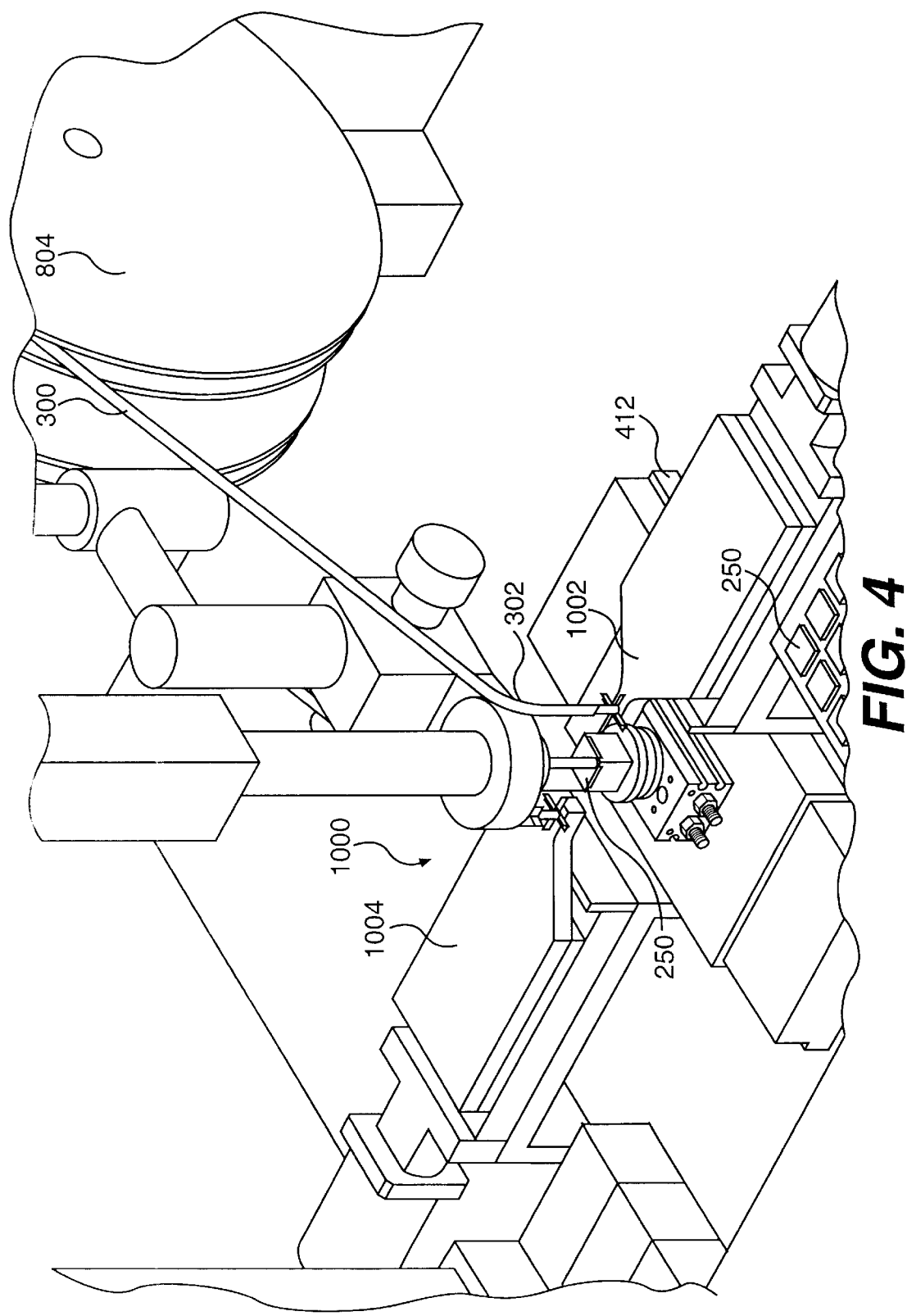
FIG. 4 is a perspective schematic view of the lead insertion mechanism according to the present invention.

Preferably, a lead insertion machine 10 includes a lead supply line 300 that corresponds to each substrate feeder assembly 200. As shown in FIG. 4, there is a lead supply line 300 on each side of the lead insertion machine 10. A supply of leads 310 for insertion into substrate 250 travels as part of lead supply line 300 to the lead insertion mechanism 1000.

As shown in FIG. 3, a lead insertion machine 10 utilizes substrate moving assemblies 400 to locate and support a substrate 250 adjacent the lead insertion mechanism 1000 so leads 310 may be inserted therein. Preferably, substrate moving assemblies 400 include a support member 500 for supporting the substrate 250 during the insertion process. Support members 500 are moveable along a carriage 412 by motors (not shown). The substrate moving assembly 400 in accordance with an embodiment of the invention uses the cameras of the vision guidance assembly 1600 to determine the appropriate location along carriage 412. As shown in FIG. 3, while one substrate moving assembly 400 is located in proximity to insertion mechanism 1000, the other substrate moving assembly 400 is located at an end of carriage 412.

In accordance with an embodiment, robot assembly 600 picks up a substrate 250 that has been discharged from a tube 202 and places the substrate 250 on one of the support members 500. After receiving the substrate 250, the support member 500 is moved adjacent to the lead insertion mechanism 1000. While leads 310 are being inserted into one substrate 250, the robot assembly 600 moves to pick up another substrate 250 from the substrate feeder assembly 200 and places it on the other support member 500 located at an end of carriage 412. Accordingly, when a support member 500 does not have a substrate 250 located thereon, the robot assembly 600 will move to pick up a substrate 250 from the substrate feeder assembly 200 and place it on the empty support member 500. This process of transporting the substrate 250 repeats during the manufacturing process until all of the substrates 250 have been processed.

In accordance with an embodiment, robot assembly 600 also removes completed substrates 250 from the support member 500 after all of its leads 310 have been inserted. Thus, when all of a particular substrate's leads have been inserted, the support member 500 with the completed substrate 250 moves to the end of carriage 412. In the meantime, the other support member 500, which contains a new substrate 250, moves from the opposite end of carriage 412 into proximity with insertion mechanism 1000 so that leads 310 may be inserted therein. At this point, robot assembly 600 moves over the completed substrate 250 and moves the completed substrate 250 to a product carriage 1224 on the conveyor assembly 1200. After the completed substrate 250 is moved to a product carriage 1224, robot assembly 600 places a new substrate 250 on the now empty support member 500 and the process is repeated.

Figure 5:
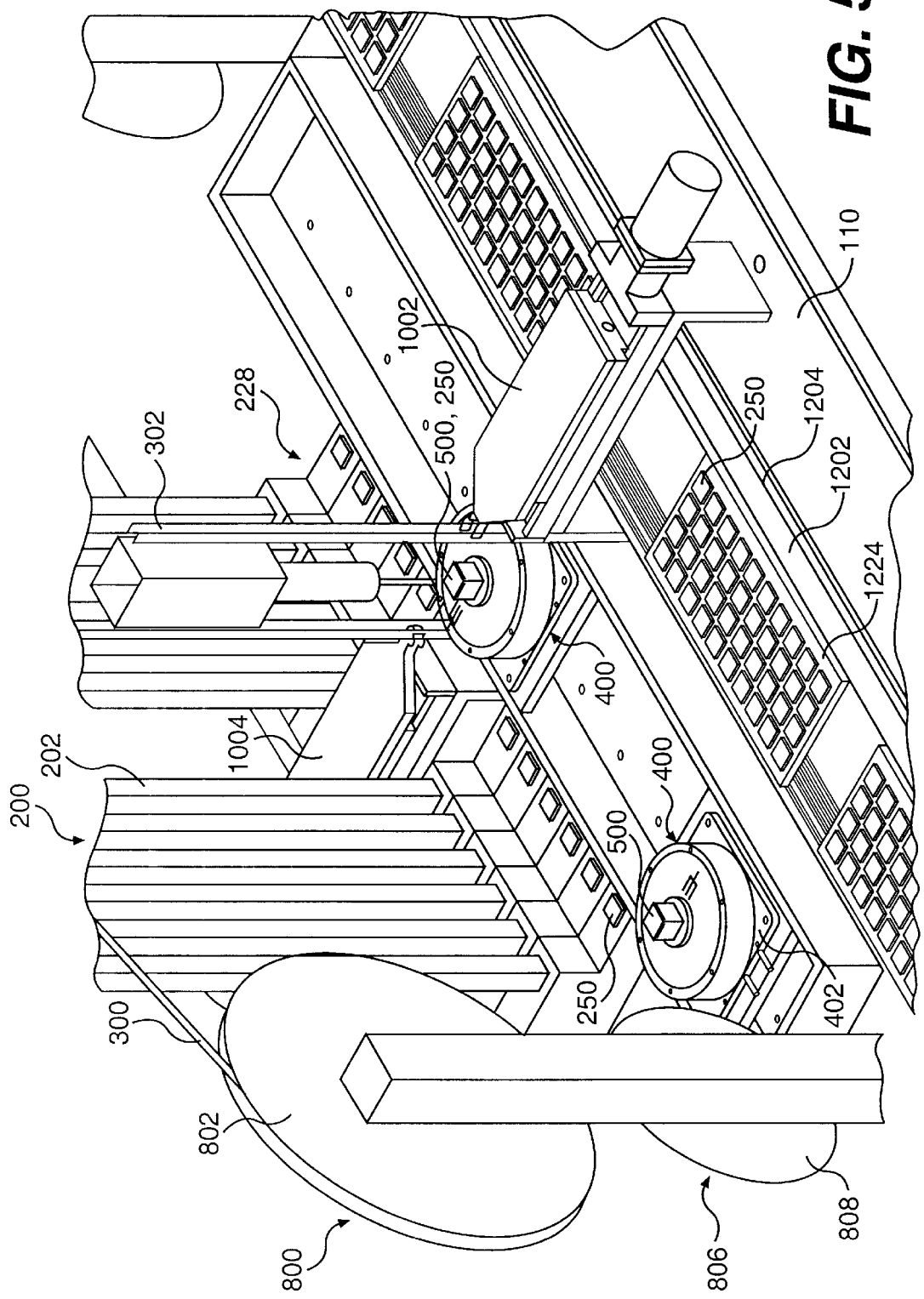
FIG. 5 is another perspective view of the lead insertion mechanism of FIG. 1.
Figure 6:
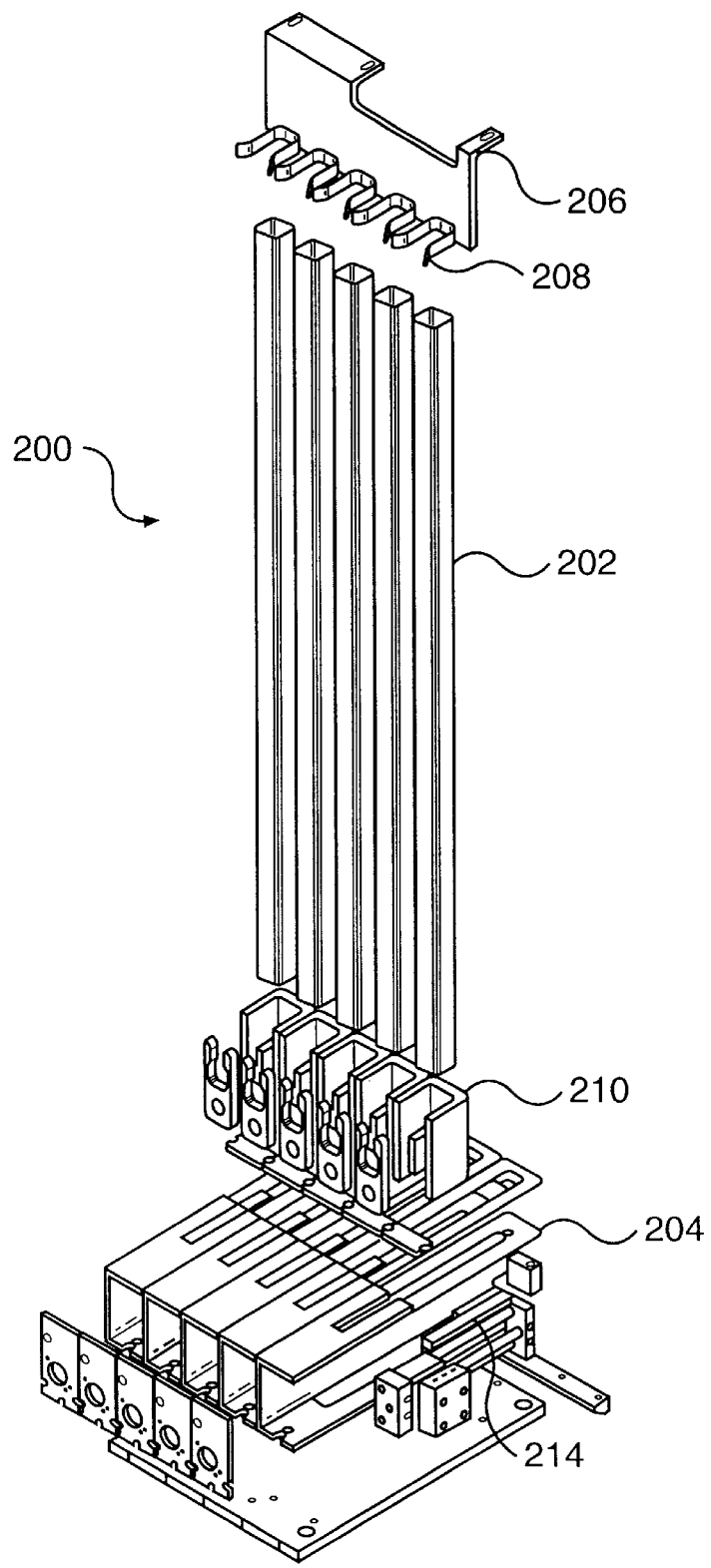
FIG. 6 is an exploded isometric view of a substrate feeder assembly according to the present invention.
Figure 7:
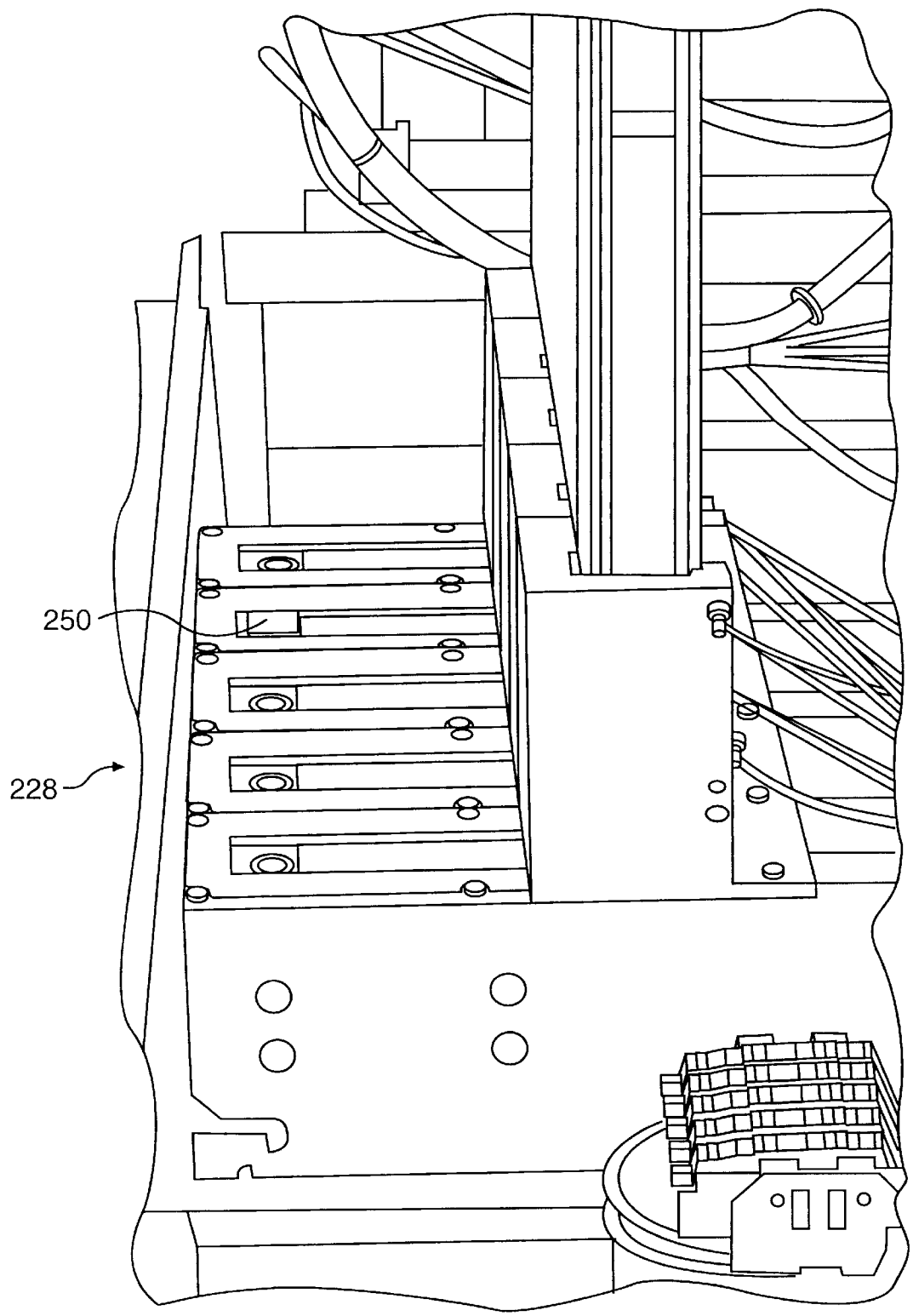
FIG. 7 is a perspective view of the base of the substrate feeder assembly of FIG. 6.

An example of an embodiment of a lead insertion mechanism 1000 is shown in schematic form in FIGS. 4 and 5. The lead insertion mechanism 1000 includes a lead insertion component 1002, 1004 on each side of carriage 412.

In accordance with an embodiment of the invention, the lead supply line 300 is fed into the supply column of lead insertion component 1002. When the lead insertion component 1002 is operated, leads 310 are pushed into the substrate 250 on the support member 500. Thus, the leads 310 from each lead insertion component 1002 and 1004 are inserted simultaneously into the substrate 250.

During operation of a lead insertion machine, after a first set of leads 310 is advanced by lead insertion component 1002 into the substrate 250, the support member 500 is moved along carriage 412 to align the next set of empty lead passages 254 of substrate 250 with the next set of leads 310 to be inserted. This incremental movement of the support member 500 is repeated until the lead passages 254 along two opposing side walls 252 of the substrate 250 are filled. At this point, the support member 500 rotates 90 degrees, and the insertion process is repeated along the other two side walls 254 of the substrate 250.

In an embodiment of a lead insertion machine, when all of the desired lead passages 254 of an individual substrate 250 are filled with leads 310, the support member 500 on which the completed substrate is carried is moved to an end of carriage 412. Then, robot assembly 600 picks up the completed substrate 250 from the support member 500 and delivers it to the conveyor assembly 1200.

An embodiment of the conveyor assembly 1200 of the lead insertion machine 10 includes multiple product carriages 1224 that are supported by two rails 1202 (see FIG. 5). Finished substrates 250 are placed on a product carriage 1224, which, when full, is removed from the lead insertion machine 10 by the operator and replaced by an empty product carriage 1224.

Since each of the lead supply lines 300, substrate feeder assemblies 200, and the lead insertion components 1002, 1004 of the lead insertion mechanism 1000 are similar to each other, only one of each will be discussed in detail below for simplicity.

Figure 8A:
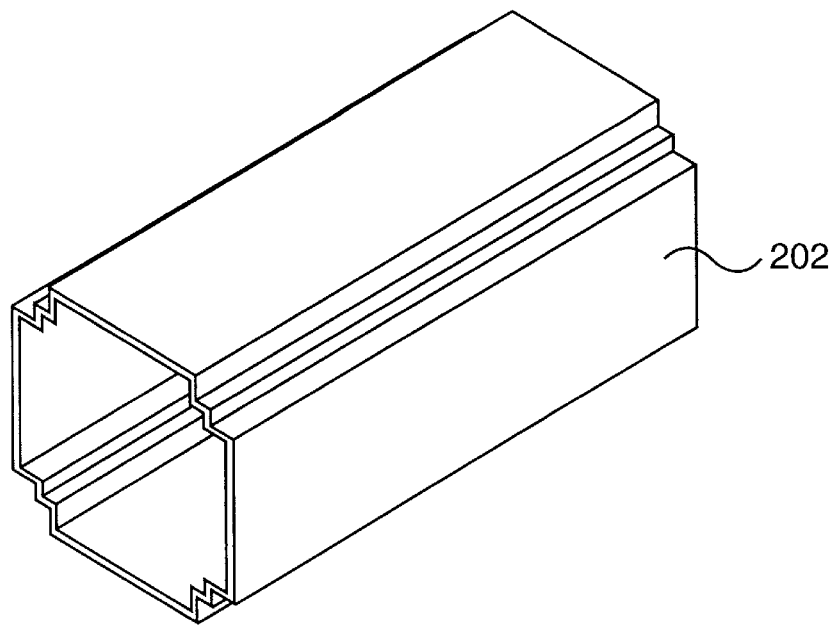
FIGS. 8A and 8B are perspective and end views of a tube of the substrate feeder assembly according to the present invention.
Figure 8B:
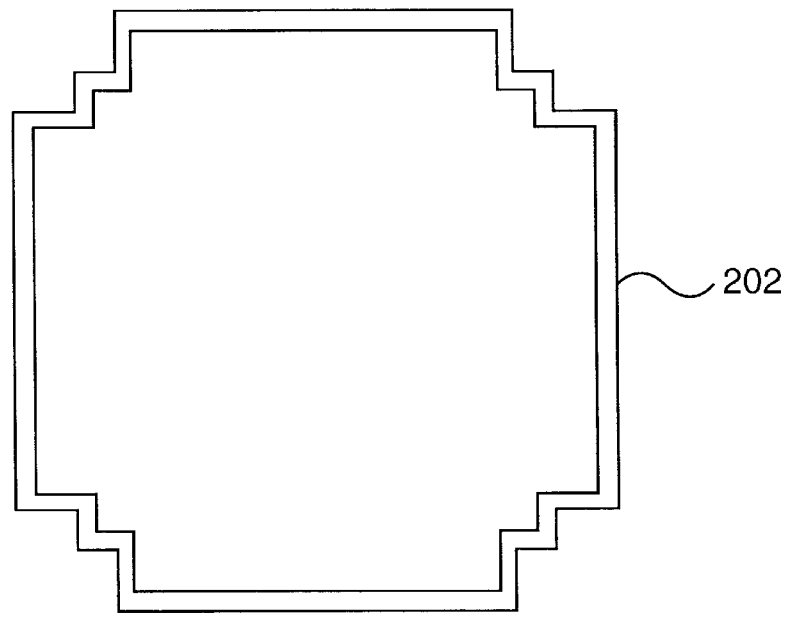

An embodiment of the substrate feeder assembly 200 will be discussed in more detail now with reference to FIGS. 6–8B. As previously discussed, substrate feeder assemblies 200 include tubes 202 for storing substrates 250 prior to insertion of any conductive leads 310. Each tube 202 is supported on its bottom by holder 210 mounted on a frame 204. Each tube 202 is prevented from moving laterally by clips 208 on a bracket 206 that is mounted to frame 100 for support. FIGS. 8A and 8B are perspective and end views of an exemplary tube 202. An end cap (not shown) may be placed on the top of each tube 202. Preferably, the tubes 202 are made from plastic, although any rigid material may be utilized.

In accordance with an embodiment of the invention, substrates 250 are loaded on top of each other into the tubes 202. Substrate feeder assembly 200 includes sensors (not shown) to detect when a tube 202 is full or empty. Substrates 250 are dispensed one at a time from the bottom of each tube 202 by a pusher 214 that is operated by air from an air supply (not shown). Pusher 214 is used to push out the bottom substrate 250 into a nest 228 (see FIG. 7). After a substrate 250 is dispensed from a tube 202, the robot assembly 600 picks up the substrate 250 from nest 228. Additional sensors are used to detect when a substrate 250 is in the nest 228. As previously discussed, robot assembly 600 takes the substrate 250 that has been discharged from a tube 202 and places it on a support member 500. While any number of substrates 250 may be stored in a tube 202, preferably, at least two hundred and forty substrates 250 stored therein. When one tube 202 has been emptied, the next tube 202 begins to dispense substrates 250.

Figure 9A:
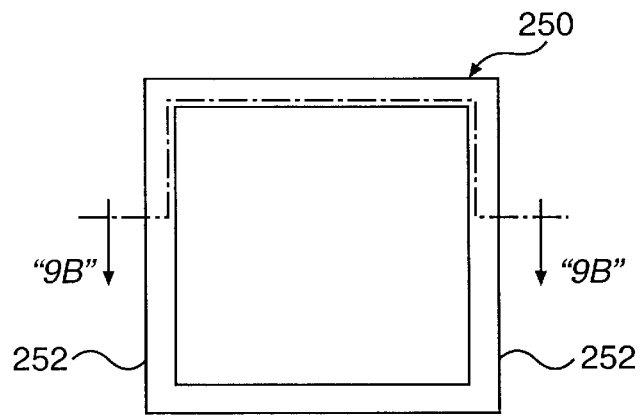
FIGS. 9A–9C are top, cross-section, and enlarged section views of a substrate according to the present invention.
Figure 9B:
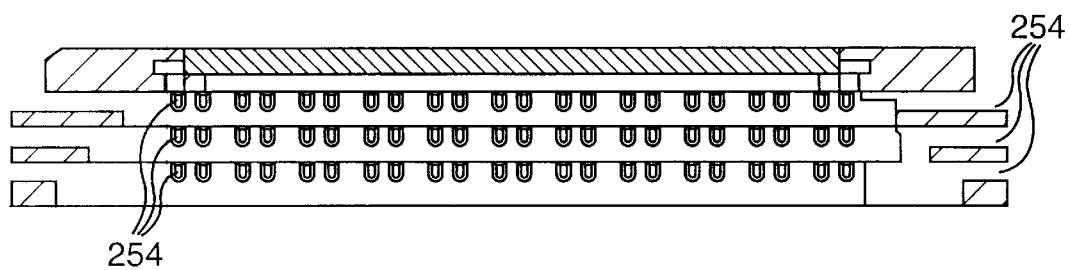
Figure 9C:
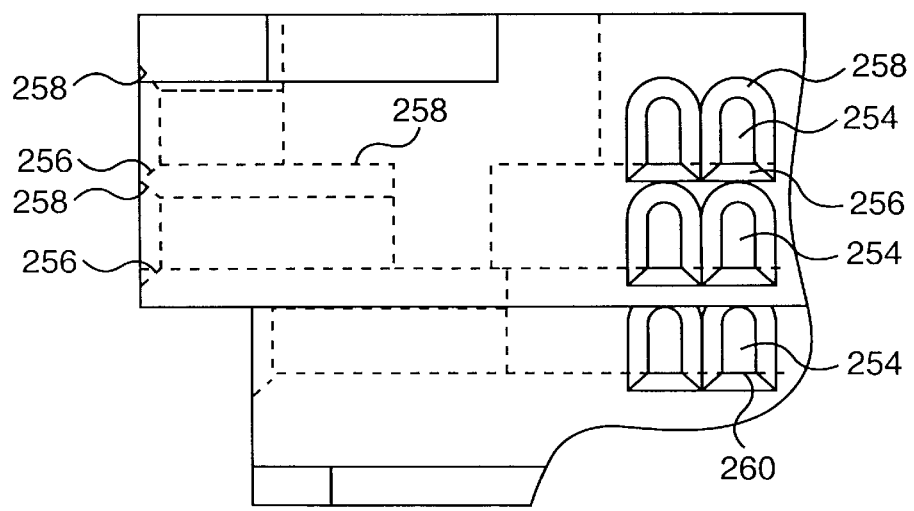

According to an embodiment of the invention, the substrate 250, shown in FIGS. 9A–9C, is similar to that disclosed in commonly-owned U.S. patent application Ser. No. 08/970,379, entitled "MULTI-CHIP MODULE HAVING INTERCONNECT DIES," which is incorporated herein by reference. The substrate 250 comprises a rectangular plastic housing with a stepped cavity located therein. The cavity of substrate 250 is defined by side walls 252. Each side wall 252 has several lead passages 254 extending therethrough. Preferably, each side wall 252 has multiple rows of lead passages 254 which may be vertically aligned as shown in FIG. 9C. Alternatively, some or all of the lead passages 254 may be staggered with respect to other ones of the lead passages. Optionally, each lead passage 254 may contain an arch 258 and an angled portion 256 to simplify lead insertion and retention. Of course, one or more of the lead passages may be rectangular, square, circular, or any other shape that corresponds to the shape of the leads. In accordance with an embodiment of the invention, each of lead passages 254 may be sized such that the leads 310 are frictionally retained therein. Although the substrate 250 is preferably made from plastic, any durable insulative material may be utilized.

Figure 10:
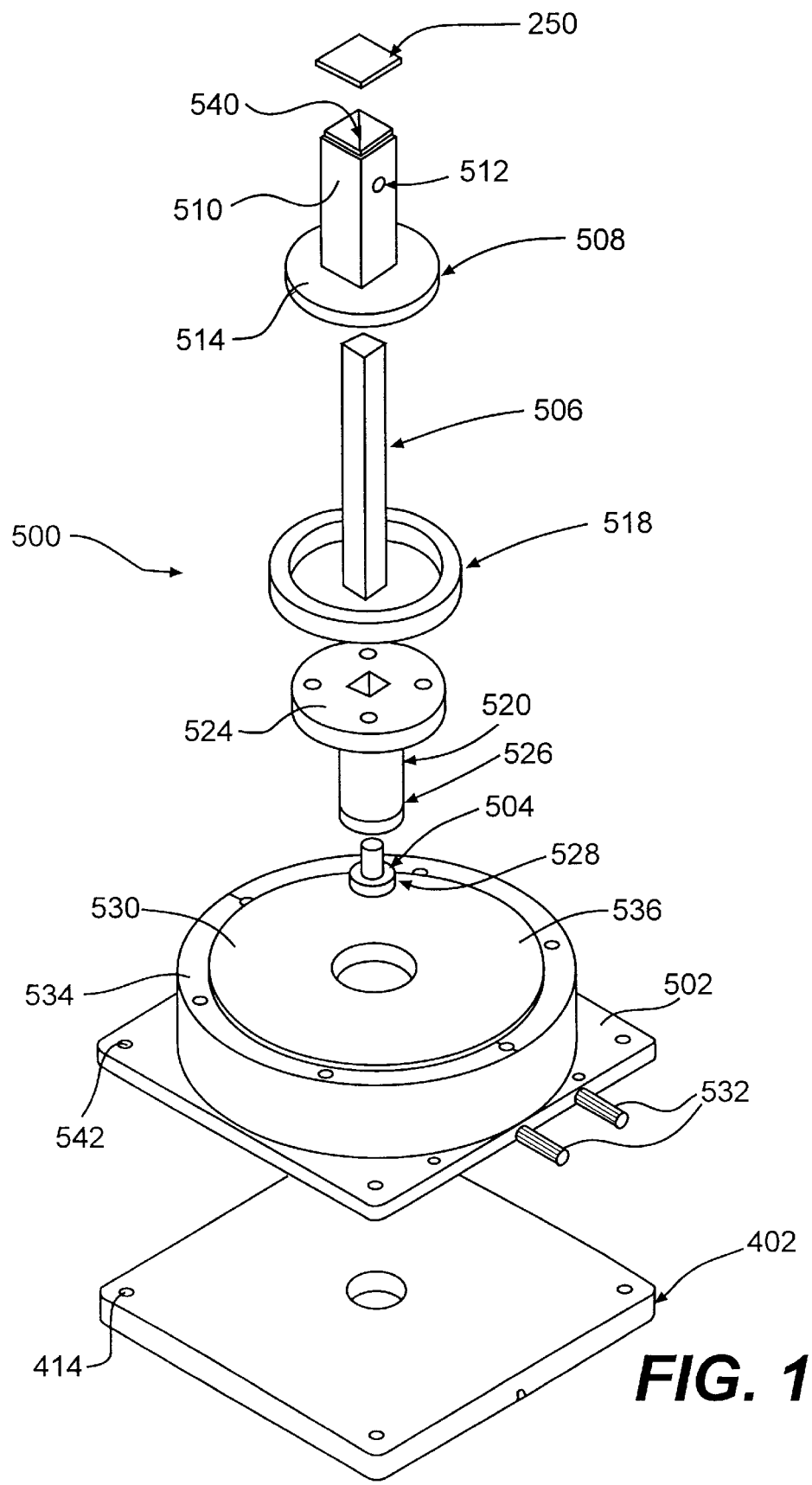
FIG. 10 is an exploded isometric view of a substrate support member according to the present invention.

Referring to FIG. 10, an embodiment of a substrate support member 500 is shown. The substrate 250 is placed on top of mandrel 508. The mandrel 508 includes a pedestal 510 and a circular body 514. The pedestal 510 has a passageway 540 along its longitudinal axis and a hole 512. A shaft 506 that is mounted on an air ring fitting 518 is inserted into the shaft passageway 540. Note that a set screw (not shown) may be inserted into hole 512 to engage a surface of shaft 506 and prevent any relative vertical movement between mandrel 508 and shaft 506. Note also that mandrel 508 may be specifically sized for a single size substrate 250. Thus, if a different size substrate 250 is used in an insertion machine, only the mandrel 508 need be changed.

In order to move the mounted substrate 250 to the lead insertion mechanism 1000, the 5 base plate 502 of the support member 500 is mounted to a platform 402 that is moved along carriage 412 by a motor (not shown). As will be discussed in greater detail herein, pedestal 510 is lifted up and rotated during the lead insertion process. To enable such movement, a rotating assembly 530 may be mounted on base 502. Rotating assembly 530 includes an outer circular body portion 534 and an inner circular body portion 536. Preferably, outer circular body portion 534 is mounted to plate 502. Plate 502 has two valves 532 connected to and in communication with rotating assembly 530. When opened, valves 532 allow a supply of air to the circular body portions 534 and 536 from a compressed air source (not shown).

An embodiment of a support member 500 includes a circular body 524 connected to a cylinder 520. A piston 504 may be inserted into one end of the cylinder 520 with O-rings 526, 528 located therebetween. By supplying air to the rotating assembly 530, circular body 524 may be lifted up and rotated relative to the rotating assembly 530. Since circular body 524 is connected to the air ring fitting 518 by fasteners (not shown), substrate 250 on mandrel 508 is lifted and rotated as the circular body 524 is lifted and rotated.

Figure 11:
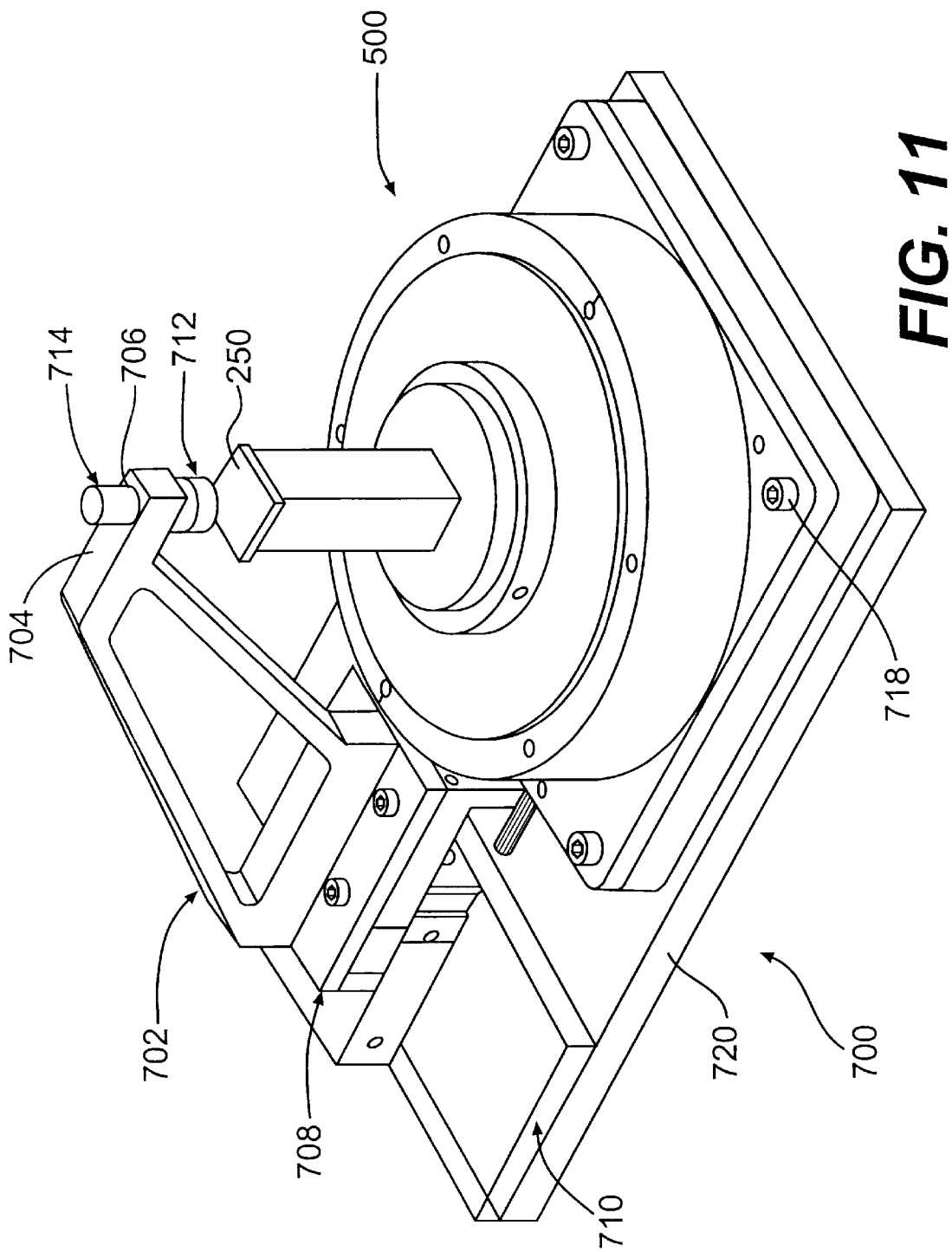
FIGS. 11 and 12 are perspective views of a substrate support assembly according to the present invention.
Figure 12:
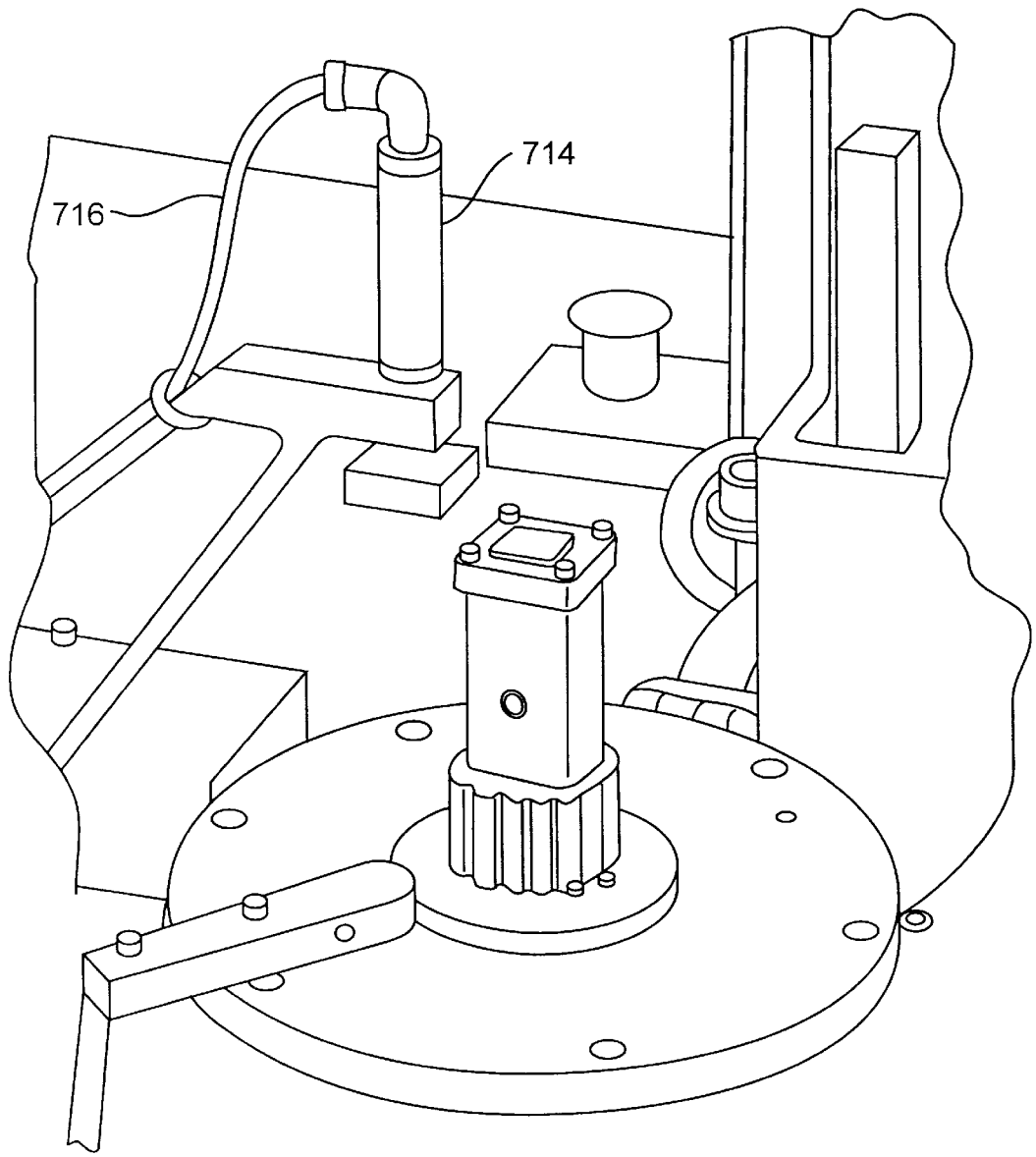

In order to ensure that the substrate 250 remains on top of the mandrel 508 during the manufacturing process, a substrate support assembly 700 is provided. An embodiment of the substrate support assembly 700 is shown in FIGS. 11 and 12. In order to prevent movement and not damage the substrate 250, a contact member 712 engages the top surface of the substrate 250. Contact member 712 is preferably made of DELRIN™, but any semi-rigid material that will not harm the surface of the substrate 250 may be utilized.

A substrate support assembly 700 includes a riser 702 that is mounted to a riser base plate 708. Riser base plate 708 is secured to base plate 710 and plate 720 by fasteners (not shown). Also, support member 500 is secured to plate 720 via support member base plate 502 and platform 402. Fasteners 718 are mounted in holes 542 and 414 to secure base plate 502 and platform 402 to plate 720. Bolts or any other similar fastening members are used as fasteners.

As previously discussed, in accordance with an embodiment of the invention, the mandrel 508 with the substrate 250 mounted thereon is lifted up and rotated during the manufacturing process. In order to provide clearance for the vertical movement of the mandrel 508, a pneumatic actuator 714 is mounted to a cantilever portion 704 of the riser 702. Pneumatic actuator 714 is located on the top of the riser 702 and has an arm (not shown) extending through a hole 706 formed in the cantilever portion 704. Actuator 714 is air operated and moves the contact member 712 vertically in and out of contact with the substrate 250. Air is supplied from a compressed air supply (not shown) to actuator 714 by tubing 716 (see FIG. 12). Tubing 716 is secured along a rear portion of the riser 702 as shown in FIG. 12.

Figure 13:
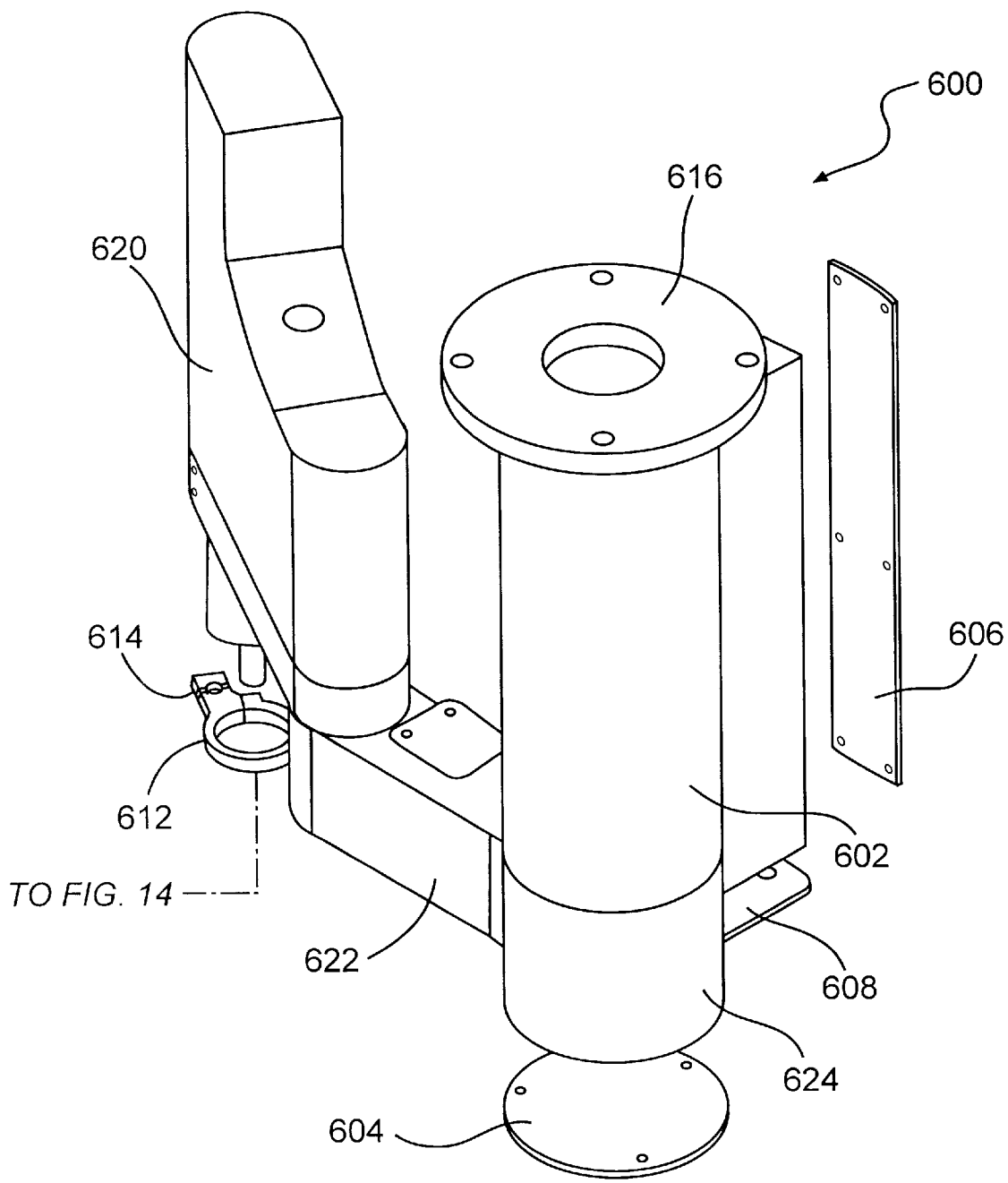
FIG. 13 is a perspective view of a robot arm assembly according to the present invention.
Figure 14:
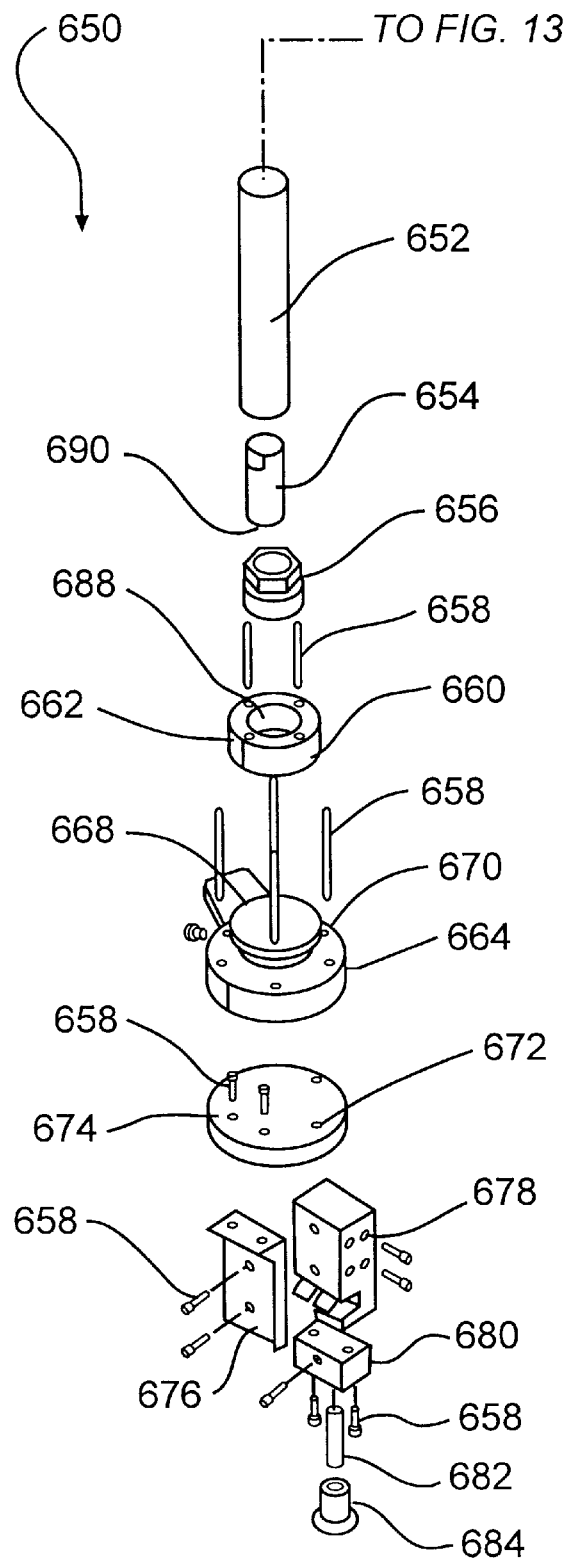
FIG. 14 is an exploded isometric of an end effector according to the present invention.

Turning to FIGS. 13 and 14, an embodiment of the robot assembly 600 and its corresponding end effector 650 are shown. The robot assembly 600 utilizes an end effector 650 mounted on the end of a robot arm 620 to pickup a substrate 250. Robot assembly 600 includes a main body 602 and a mounting portion 616 that may be connected to the frame 100 to support the robot assembly 600. A side arm 622 is rotatably mounted to the main body 602 at one end by way of a circular portion 624 that is mounted beneath the main body 602 and rotates relative thereto. The other end of side arm 622 is pivotally connected to robot arm 620. Arms 620, 622 permit the end effector 650 to be moved to any particular location on the insertion machine 10.

As shown in FIG. 13, robot assembly 600 in accordance with an embodiment of the invention includes a bottom plate 604, side plate 606, and camera bracket 608. Camera bracket 608 is used to support a camera that is part of the vision guidance assembly 1600 that is discussed in greater detail below. Also shown in FIG. 13 is a z-axis camera bracket 612 and corresponding bracket portion 614 which are used to support another camera of the vision guidance assembly 1600.

The vision guidance assembly 1600 utilizes multiple cameras (not shown) and a control system. The control system, driven by computer aided manufacturing software, is capable of selecting an image taken from a camera and evaluating the object in the image. The vision guidance assembly 1600 provides feedback for the control of the robot assembly 600. In an embodiment of the invention, four cameras are used, although differing numbers of cameras may be utilized. A first camera is used to report the location and orientation of the substrate 250 back to the control system in order to move the robot assembly 600 to the proper location. The first camera is attached to the end of robot arm 620 by brackets 612 and 614. A second camera is used to report the insertion depth of the leads 310 into the substrate 250 and the orientation of the inserted leads 310 back to the control system. The second camera is mounted on bracket 608. The vision guidance assembly 1600 may also include a third and fourth camera (each reporting the side view dimensional data of the inserted leads, such as the distance between leads, back to the control system). In an embodiment of the invention, the third and fourth cameras are located above the lead insertion components 1002, 1004 and are directed toward opposing sides of the substrate 250.

An embodiment of the end effector assembly 650 will be discussed with reference to FIG. 14. The end effector assembly 650 is mounted to the robot arm 620 of the robot assembly 600 to pickup and move a substrate 250. The end effector assembly 650 may utilize a vacuum effect in a suction cup 684 to pick up a substrate 250, although any appropriate means may be utilized to pick up a substrate 250.

An end effector assembly 650 of an embodiment of the invention includes a rod 652 that is inserted into a corresponding hole (not shown) in the robot arm 620. The end effector assembly 650 includes a quickstop 664 and a quickstop base plate 672 between rod 652 and cup 684. The quickstep 664 includes a platform 668 on its upper surface. A spacer 660 is mounted to a platform 668 by fasteners 658 through holes 662 in the spacer 660. Fasteners 658 may be bolts, screws, or any other fastening mechanism or system. A rotating member 656 is mounted inside of bore 688 through spacer 660. The rotating member 656 includes a bore 690 into which a connector 654 is mounted. Connector 654 is used to connect rod 652 to the elements mounted to quickstep 664. Preferably, connector 654 is friction fit into bore 690.

A quickstop 664 in accordance with an embodiment of the invention includes multiple holes 670 into which fasteners 658 are inserted to secure the quickstop 664 to the quickstop base plate 672. The quickstep base plate 672 includes holes 674 into which fasteners 658 are inserted to secure the quickstep base plate 672 to a bracket 676. Bracket 676 includes a connector 686 mounted on one side and a cylinder 678 mounted on another side. Fasteners 658 are used for mounting the connector 686 and the cylinder 678 as shown in FIG. 14. Cylinder 678 and vacuum plate 680 mounted on the bottom surface of the cylinder 678 are used to create a vacuum effect. Attached to plate 680 is a tube 682 that has cup 684 on its bottom end. Since the cup 684 is in fluidic communication with the vacuum plate 680, a vacuum effect is imparted to cup 684 through tube 682 to enable the robot assembly 600 to pickup the substrate 250.

The first camera, as discussed above, may be associated with the robot arm 620 and end effector 650. The first camera may be used to check for proper placement of the substrate 250 on the support member 500 before the end effector 650 releases the substrate 250. If the first camera and control system determine that the substrate 250 has been improperly placed or cannot be properly placed due to a part defect, the robot assembly 600 will not release the substrate 250 and instead robot assembly 600 places it into a reject bin (not shown). The manufacturing process continues with the next substrate 250 at that time.

Similarly, the second camera may be used to view the orientation of the leads 310 that have been inserted into the substrate 250. When the second camera detects that the leads 310 have been improperly inserted, the control system determines whether it is a major or minor variance. If the variance is considered to be minor, the position of substrate 250 is corrected and the process continues. However, if the variance is considered to be major, the insertion cycle is aborted and the robot assembly 600 picks up the substrate 250 and places it in the reject bin. At the same time, the operator is notified of the problem by the control system. In an embodiment of the invention, a yellow light (not shown) on the lead insertion machine 10 blinks to notify the operator of such a problem.

The control system of an embodiment of the invention includes another error detecting feature which detects a lead jam. If a lead 310 is jammed (not aligned with a passage 254 in the substrate 250), the lead insertion component 1002 is retracted from the substrate 250. If the jammed lead 310 has been cleared from the substrate 250 and then can be properly inserted, the insertion process is resumed. However, if the jammed lead 310 cannot be properly inserted, the operator is notified of the problem by the control system. In an embodiment of the invention, a red light (not shown) and a buzzer are operated by the control system to alert the operator of the lead jam. The operator puts the lead insertion machine 10 in its service state, opens a shield 122 of the safety enclosure 102 and removes the lead insertion component 1002 and clears the jammed lead 310. After reinserting the lead insertion component 1002, the operator puts the lead insertion machine 10 back into its run state. If the substrate 250 was damaged at all during the jam, the robot assembly 600 removes the substrate 250 and puts it into the reject bin. The lead insertion process is then resumed.

An embodiment of the lead insertion machine in accordance with an embodiment of the invention 10 may also include an emergency stop (not shown) at each corner of the frame 100. The emergency stops operate as kill switches that enable the operator to quickly stop the lead insertion process for any reason.

Figure 15:
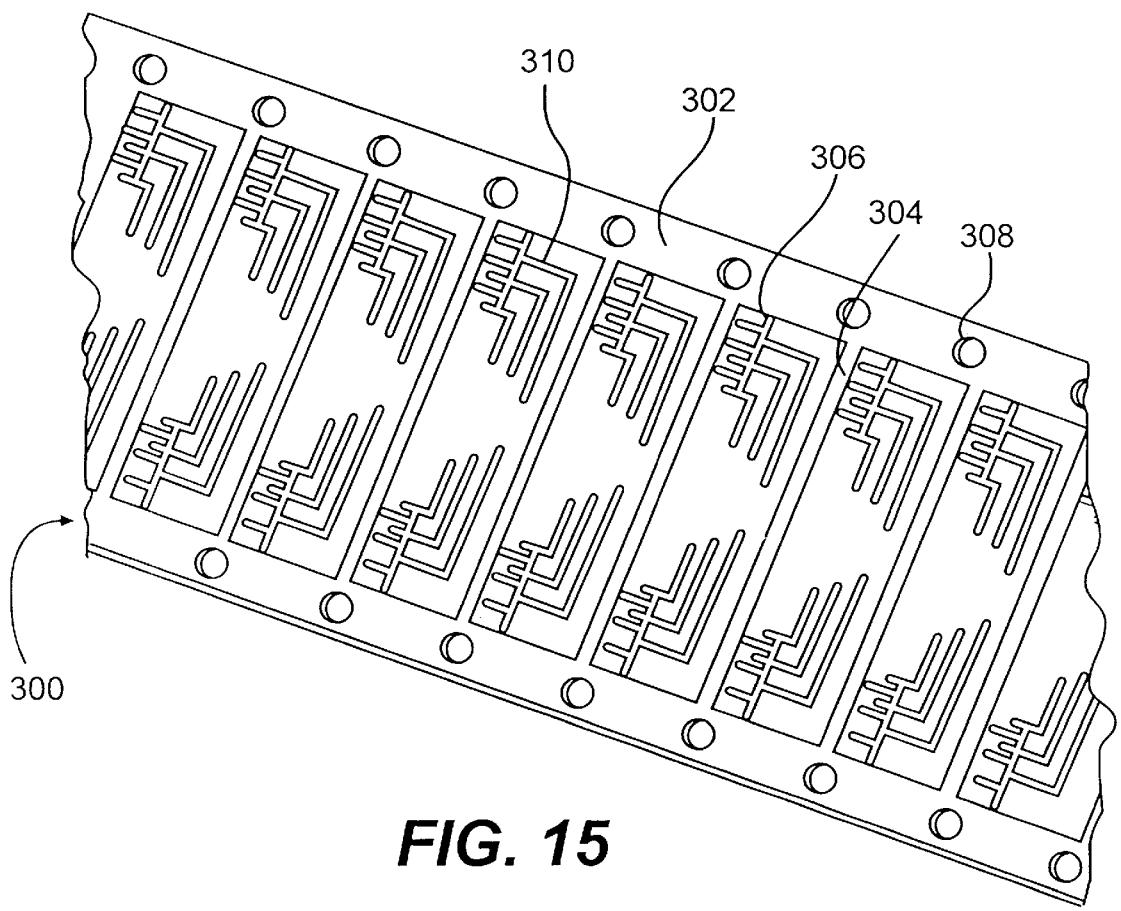
FIG. 15 is a top view of a lead carrier strip according to the present invention.

A lead supply line 300 in accordance with an embodiment of the invention is shown in FIG. 15. The lead supply line 300 may include either a carrier tape or a carrier strip and conductive leads 310 mounted thereto. Initially, the carrier strip 302 and conductive leads 310 may be punched from a very narrow sheet of metal by a lead punch machine (not shown). The result is a continuous lead supply line 300 as shown in FIG. 15. In accordance with an embodiment of the invention, the lead punching machine uses substantially L-shaped punches so as to form substantially L-shaped leads. In one embodiment, the leads may have a rectangular cross-section. The leads, however, may be any desired shape and or cross-section that serves to enable electrical connection between a die in the die carrier and a board or substrate. Further, while FIG. 15 shows the conductive leads 310 as formed in sets of three, the number of leads 310 in each set may be varied as desired.

In accordance with an embodiment of the invention, the lead supply line 300 is in the form of a carrier 302 with tie bars 304 spaced periodically between the two sides of the carrier 302. Attached to the tie bars 304 are mounting elements 306. Each conductive lead 310 is connected to a mounting element 306. As shown in FIG. 15, carrier 302 also includes alignment holes 308 on each side, the function of which will be described in greater later with respect to the lead insertion mechanism 1000. Carrier 302 is continuous and mounted to a tape-like backing or interleaf 312 to provide additional support (see FIG. 16). Carrier 302 and backing 312 are rolled onto a reel 802 that is used in the lead insertion machine 10.

In accordance with an embodiment of the invention, reel 802 is shown in FIG. 16 with carrier 302 and its corresponding backing 312 located thereon. As the reel 802 is rotated by motor 848 (see FIG. 17), carrier 302 may be fed in one direction toward the lead insertion mechanism 1000 and the backing 312 may be wound onto a take-up reel 808 assembly in a separate direction.

Figure 17:
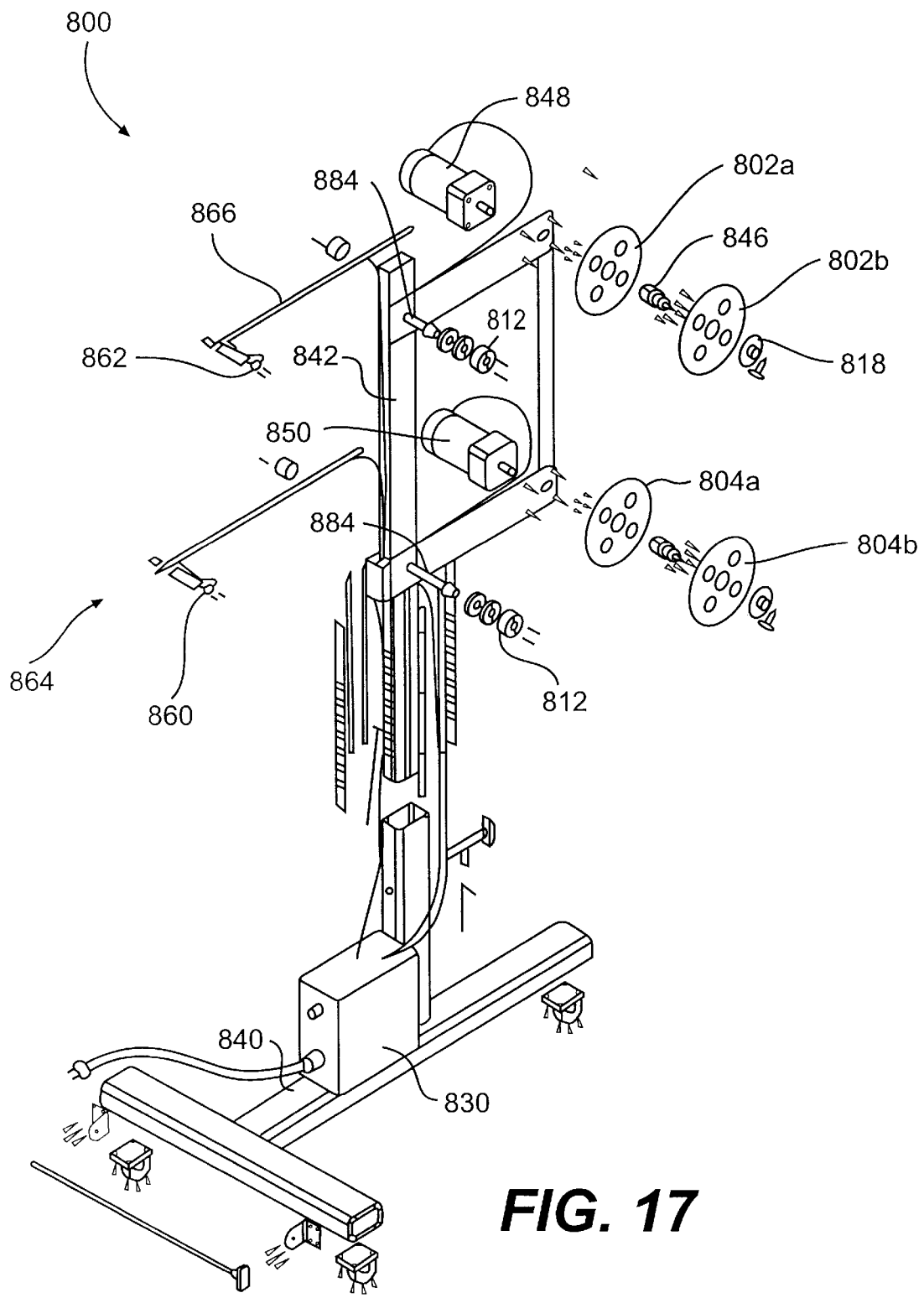
FIG. 17 is an exploded isometric view of the dereeler assembly according to the present invention.

An embodiment of the dereeler assembly 800 in accordance with an embodiment of the invention is shown in FIG. 17. Dereeler assembly 800 includes reels 802, 804 that may be driven by motors 848, 850 powered by electrical power supply 830. Reels 802 and 804 include fixed reel portions 802*a*, 804*a* and rotating real portions 802*b*, 804*b*, respectively. Since reels 802 and 804 are identical, only reel 802 will be discussed in detail.

In accordance with an embodiment of the invention, reel 802 includes a hub 846 on which the lead supply line 300 may be wound. Reel 802 also includes reels 802*a*, 802*b*, and a hub 818 as shown in FIG. 17. Hub 846 is a friction hub that prevents reel 802 from over spinning when the lead supply line 300 is advanced. Reels 802 and 804 are mounted to a front member of an upper frame 842. The dereeler assembly 800 includes take-up reels 808 that are mounted to shafts 884 on rear member of the upper frame 842. Upper frame 842 is inserted into lower frame 840 and located in close proximity to safety enclosure 102 of the lead insertion machine 10.

Dereeler assembly 800 in accordance with an embodiment of the invention includes electrical strip sensors 860, 862 mounted on the ends of arms 864, 866. These sensors 860, 862 signal the control system to control the speed at which the lead supply line 300 is drawn from reel 802.

Referring to FIGS. 35A–C, an embodiment of the take-up reel 808 is shown. The take-up reel 808 includes a smooth front surface 886, a ribbed back surface 888, and openings 816 between the surfaces 886, 888. As shown in FIG. 35C, take-up reel 808 includes an integral hub 880 onto which the interleaf 312 may be wound. Since the take-up reel 808 is open on one side as shown in FIG. 35C, the interleaf 312 wound on hub 880 may be easily and quickly removed.

In accordance with an embodiment of the invention, take-up reel assembly 806 may also includes a clamp (not shown) on the hub 880 to clamp an end of the interleaf 312. An opening 882 is formed through hub 880 for insertion of reel 808 onto shaft 884. Take-up reel 808 may be preferably driven by a motor (not shown) and a drive slip clutch 812 which is used to keep tension on the supply reel 802.

Figure 18:
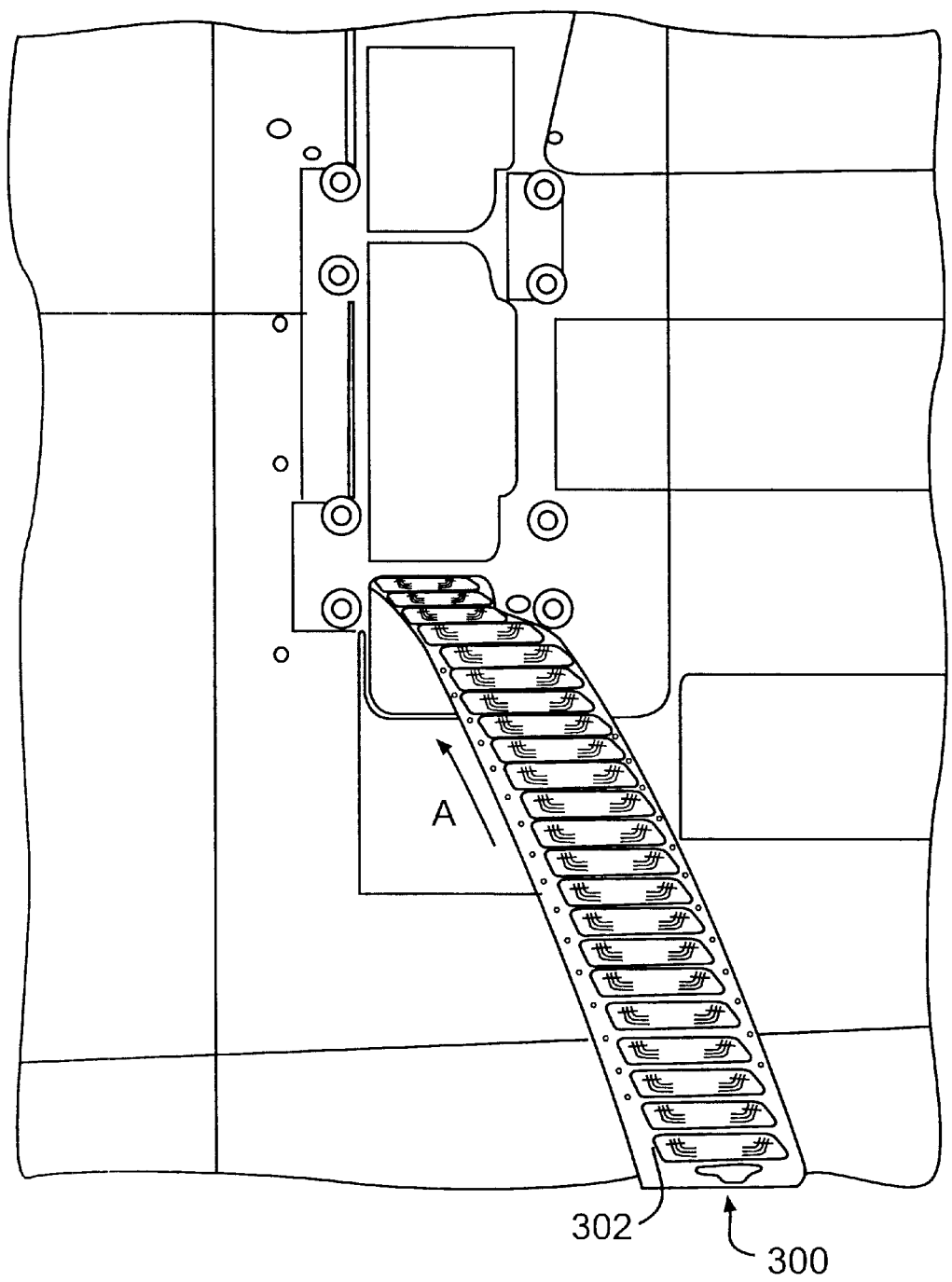
FIG. 18 is an end view showing the carrier strip inserted into the splitter assembly according to the present invention.

Before lead supply line 300 is fed to insertion mechanism 1000, lead supply line 300 must be broken into two sections along tie bar 304. This may be accomplished via splitter assembly 900. Once the carrier 302 is separated from the interleaf 312, it is fed into the splitter assembly 900 in the direction of the "A" arrow as shown in FIG. 18. Splitter assembly 900 receives the carrier 302 and splits the tie bars 304 so that the carrier 302 is split into two portions.

Figure 19:
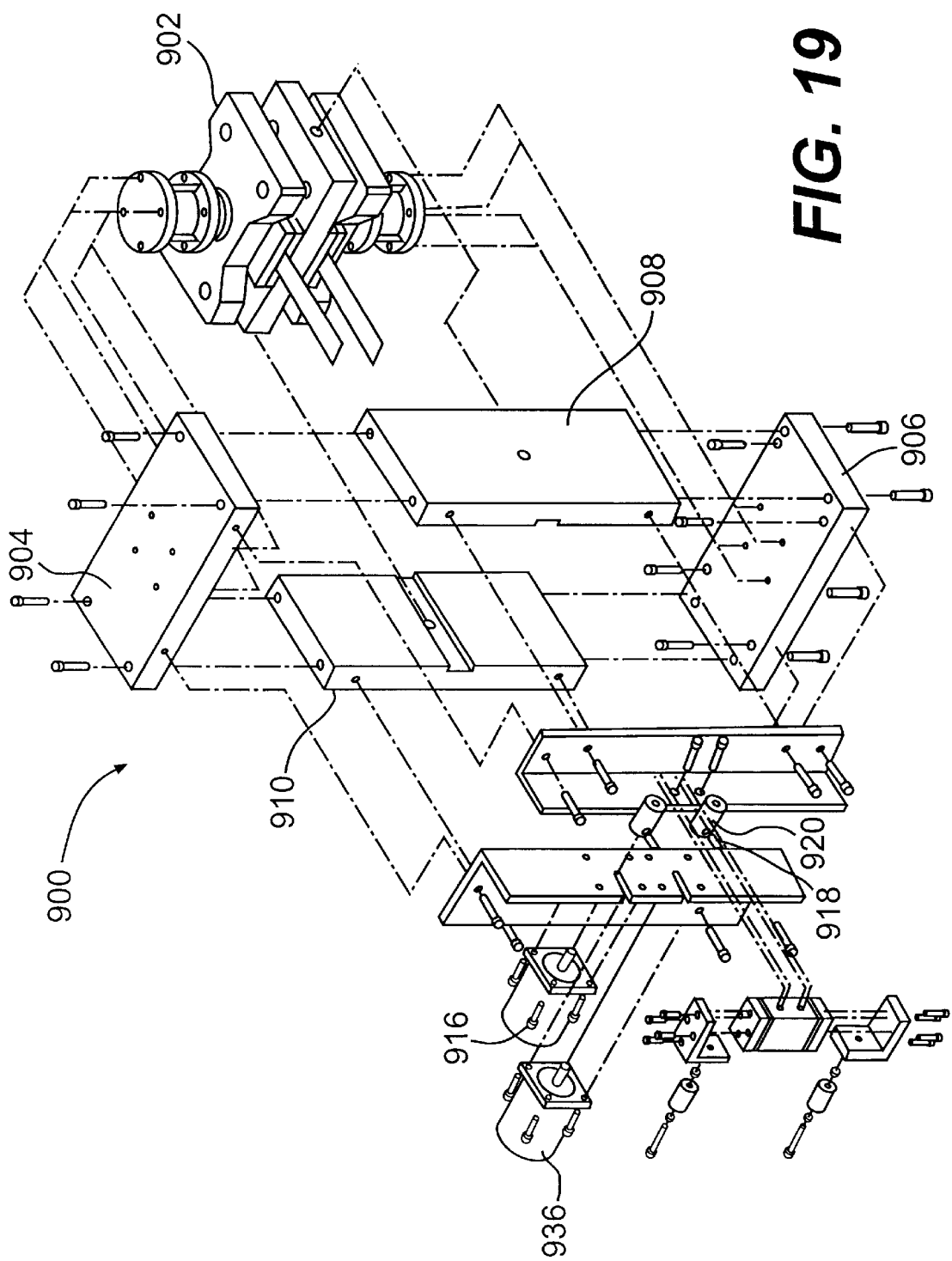
FIG. 19 is an exploded isometric view of the splitter assembly according to the present invention.

An embodiment of the splitter assembly 900 in accordance with an embodiment of the invention is shown in FIG. 19. Splitter assembly 900 includes a frame that supports a splitter die assembly 902. Frame includes a top plate 904, bottom plate 906, and side plates 908, 910.

Mounted to frame are two rollers 918, 920 between which the carrier 302 is initially inserted.

Rollers 918, 920 are operated by motors 916, 936 to deliver the carrier 302 to the splitter die assembly 902. The splitter die assembly 902 may include a though beam sensor that looks through the alignment holes 308 and continuously reports the position of the carrier 302 back to the controller. The sensors are used to locate splices in the carrier 302 and indicate such splices to the controller.

The splitter die assembly 902 in accordance with an embodiment of the invention also includes a splitter die (not shown) that punches out or cuts each tie bar 304 of the carrier 302. As a result, the carrier 302 emerges from the splitter assembly 900 in two sections 302A and 302B that are substantially mirror images of each other. In accordance with an embodiment of the invention, the splitter die 902 is pneumatically operated.

Figure 20:
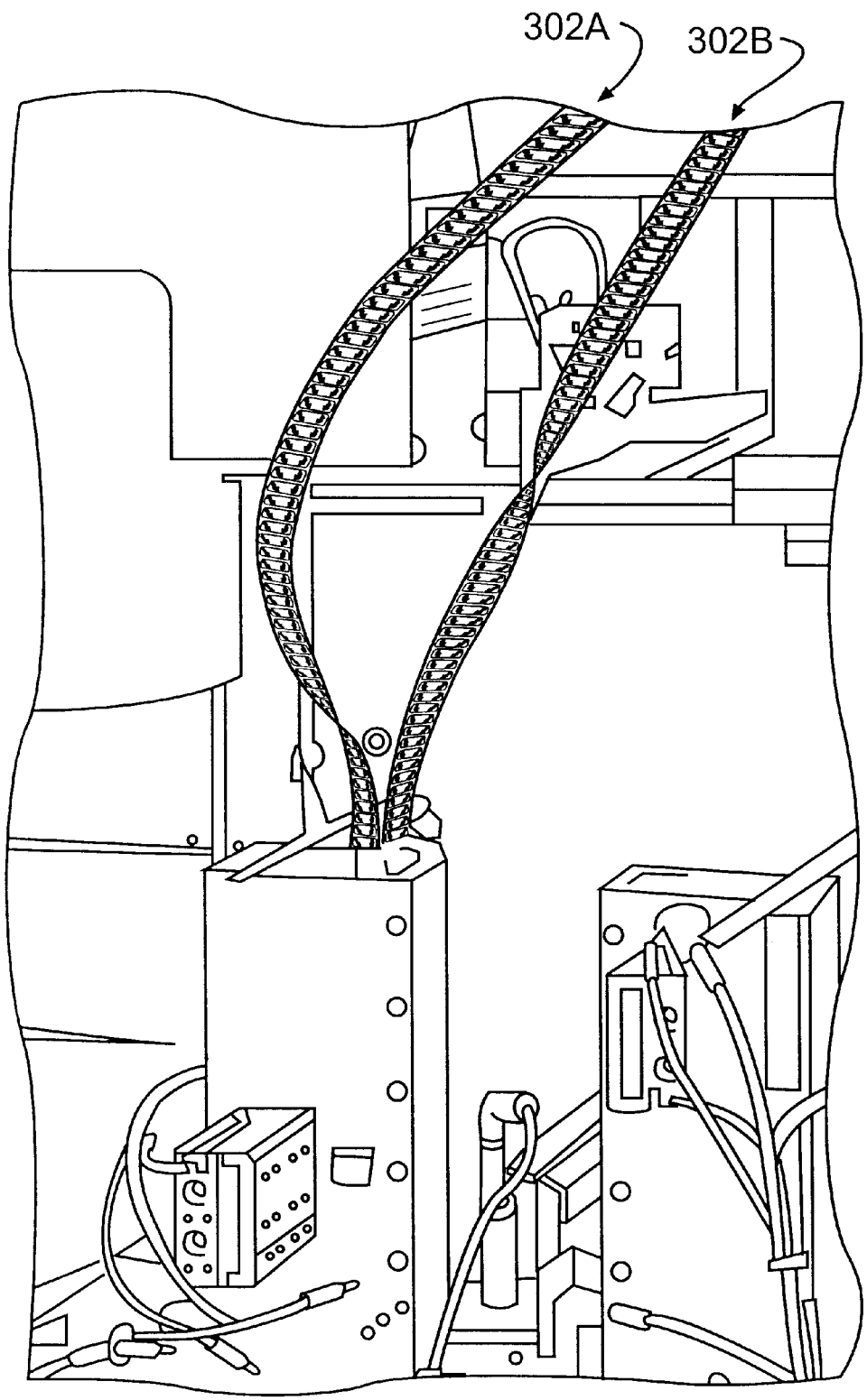
FIG. 20 is a side view of the carrier strip and a lead insertion component according to the present invention.
Figure 21:
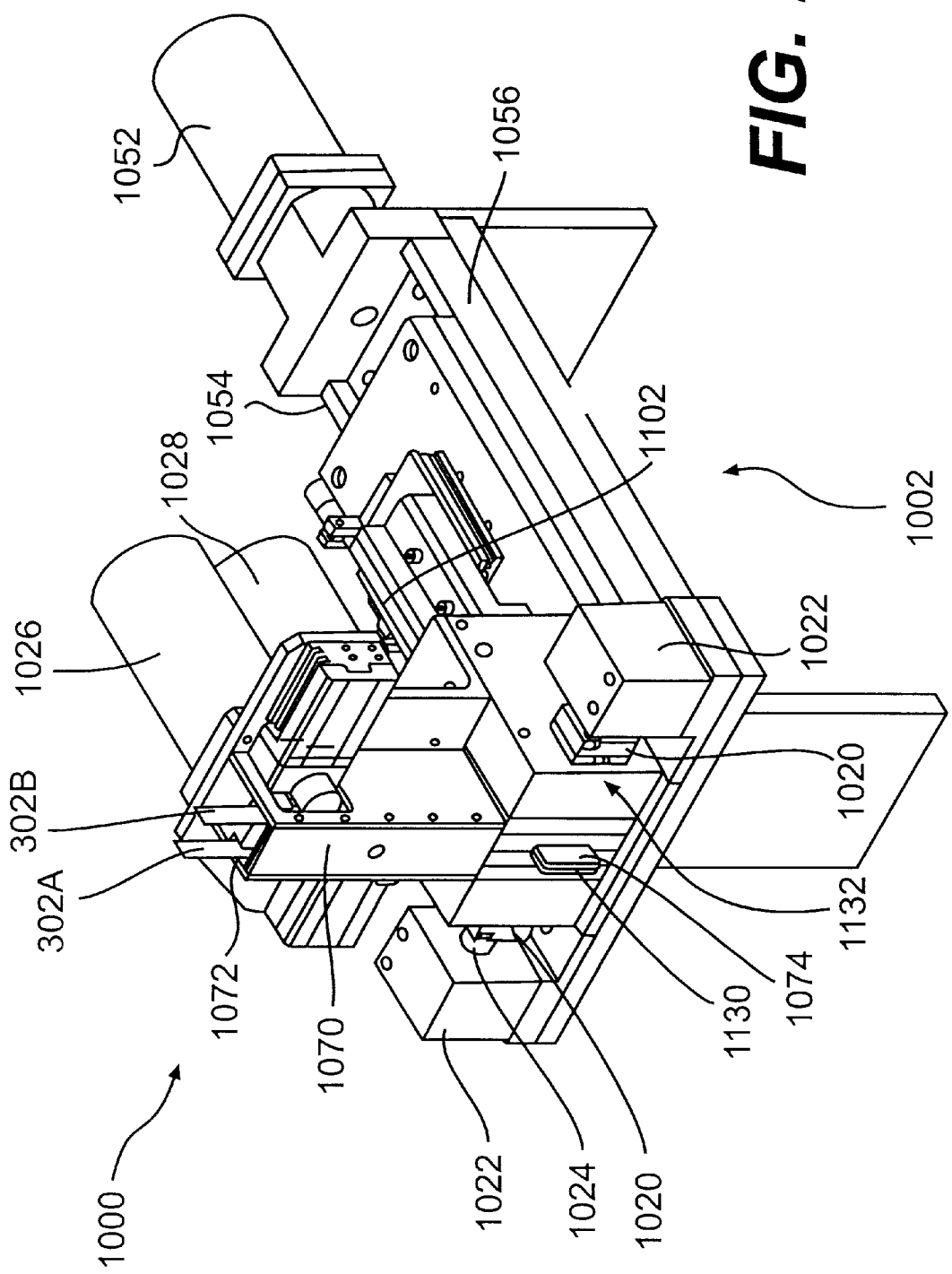
FIGS. 21 and 22 are perspective views of a lead insertion component according to the present invention.
Figure 22:
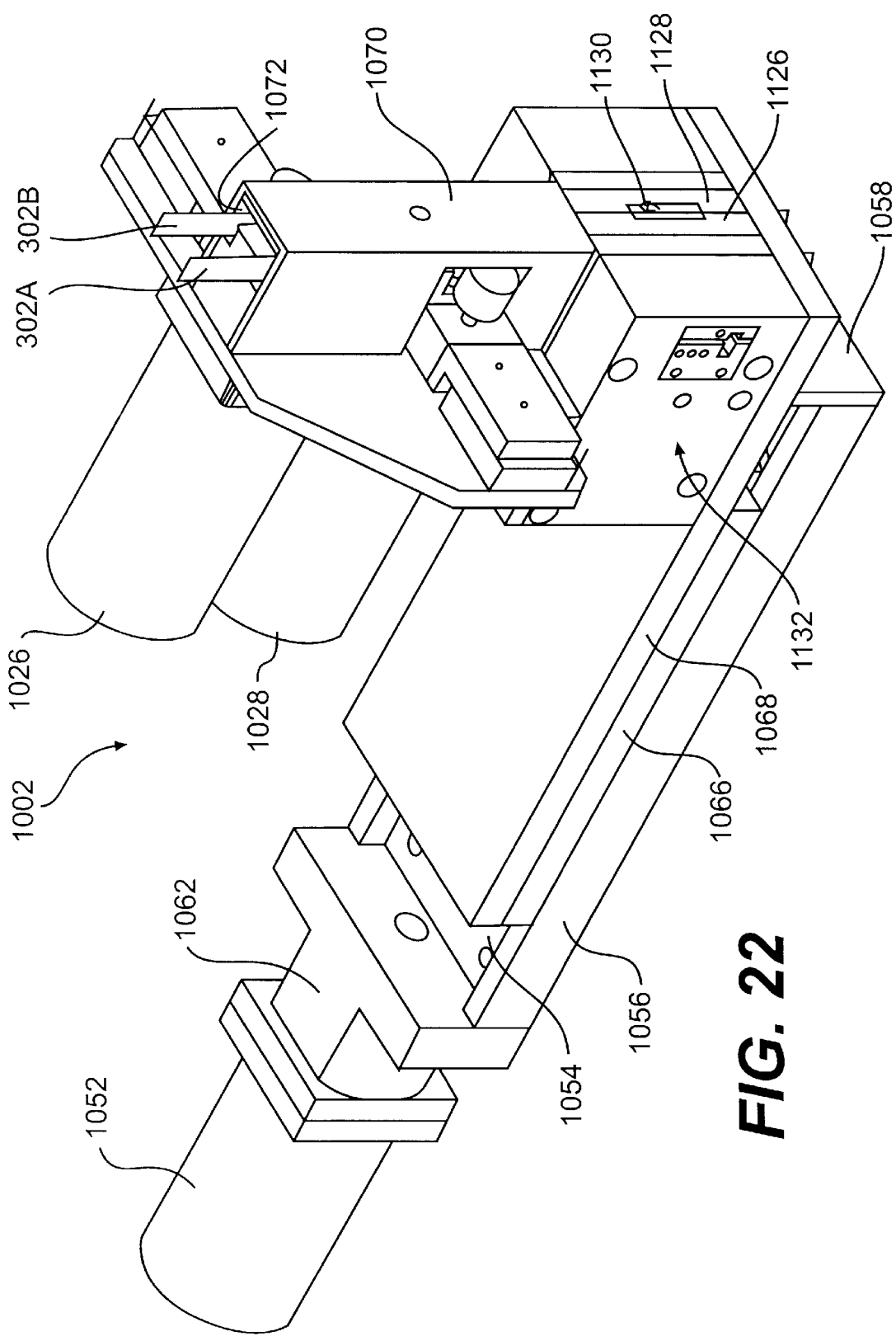

In accordance with an embodiment of the invention, the separated carriers 302A and 302B are then supplied to the lead insertion mechanism 1000 as shown in FIGS. 20–22. As shown in FIG. 21, carriers 302 are shown entering the channel 1072 of a supply column 1070 of a lead insertion component 1002. Inside of the supply column 1070 are pairs of pinch rollers (not shown) that are operated by motors 1026, 1028 (see FIGS. 21, 22). Each pair of pinch rollers grasps a carrier 302 between them and pulls it into the supply column 1070. Supply column 1070 also includes through beam sensors located above dies 1006, 1008 that look through the alignment holes 308 to ensure that the carrier 302 is properly aligned before each set of leads 310 is punched.

A lead insertion component 1002 in accordance with an embodiment of the invention is shown in greater detail in FIGS. 21 and 22. The lead insertion component 1002 takes the conductive leads 310 from the carrier 310 and inserts them into lead passages 254 in a particular substrate 250. The lead insertion component 1002 includes a punching member 1020 and dies 1006, 1008 (see FIG. 25) to separate the leads 310 from the carriers 302A and 302B. The punching member 1020 has a lead punch 1030, scrap punch 1040, and alignment pins 1036 attached to a surface. Thus, when the punching member 1020 is moved in direction A or B, punches 1030, 1040 and pins 1036 move as well (see FIG. 25).

Figure 25:
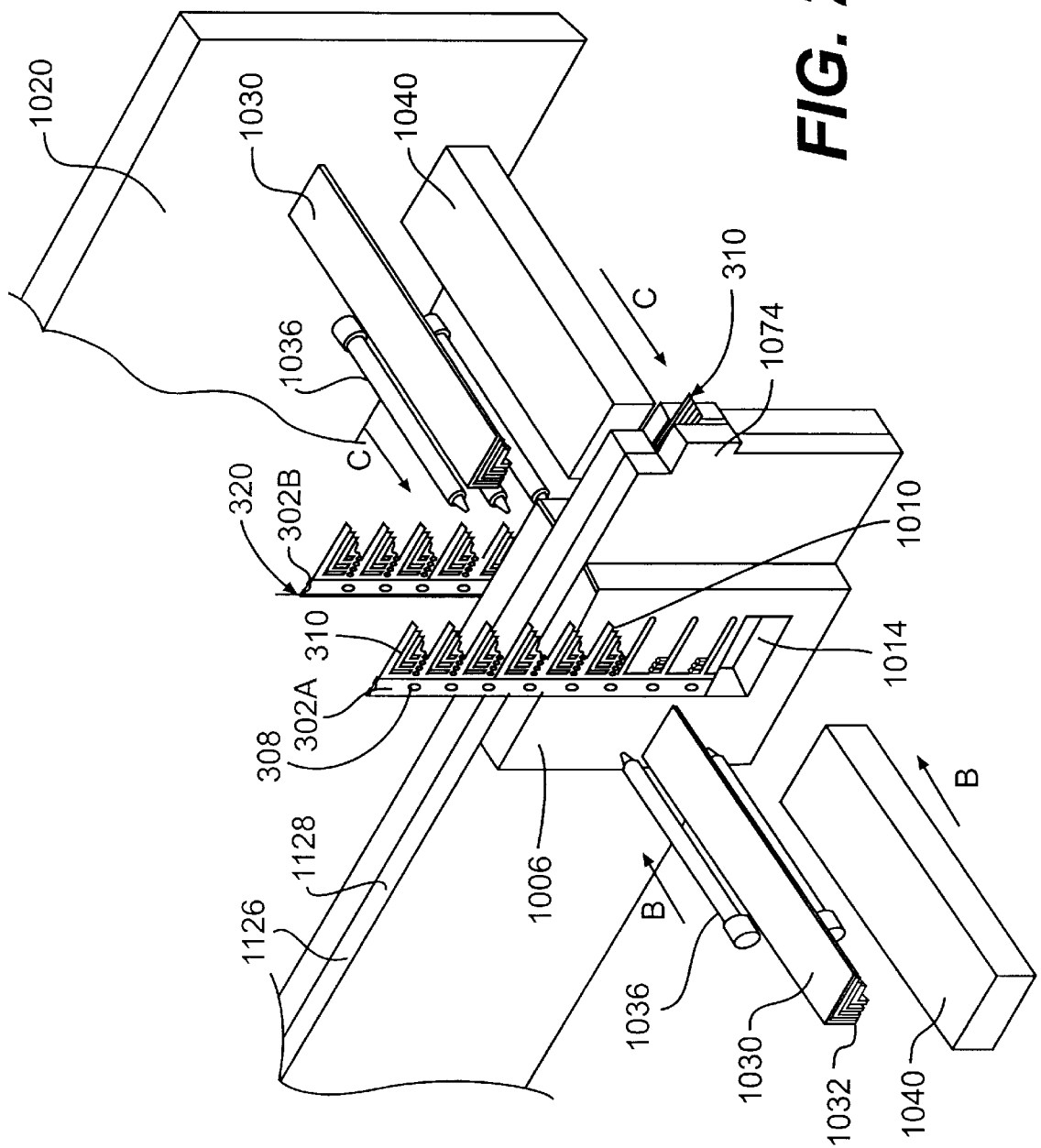
FIGS. 25–27 are perspective views showing the relative movement between punching elements, carrier strip, and dies according to the present invention.

In accordance with an embodiment of the invention, punch 1030 separates leads 310 from carrier 302 and moves leads 310 into grooves 1108 on a lead pusher 1102 (see FIG. 25). As shown in FIGS. 21 and 22, an embodiment of lead pusher 1102 is then moved to insert the leads 310 into the substrate 250. Lead pusher 1102 is moved linearly within a tunnel 1130 formed between plates 1126, 1128 of a housing 1132. Lead pusher 1102 may be moved using motor 1052. Motor 1052 may be mounted to extension 1062 of a tray 1054 by fasteners (not shown). Motor 1052 rotates a spindle (not shown) that moves plates 1066 and 1068 along tray 1054. Tray 1054 includes side walls 1056 with top surfaces along which plate 1066 slides. Tray 1054 also includes an end wall 1058 which limits the travel of plate 1066.

The lead insertion component 1002 in accordance with an embodiment of the invention also includes punch drivers 1022 and arms 1024 that are connected to punching element 1020. In an embodiment, punch drivers 1022 are electromagnetic solenoids, however, any suitable drive mechanism may be utilized.

Referring to FIGS. 23A–D, an embodiment of the lead pusher 1102 in accordance with an embodiment of the invention is shown. Lead pusher 1102 includes an inserting end 1106 with a lead holding area 1104. Lead holding area 1104 includes grooves 1108a, b, c, d that are separated by fingers 1120a, b, c, d on both a first side 1110 and a second side 1112 of the lead pusher 1102. In accordance with an embodiment of the invention, the length of each of the fingers 1120a, b, c, d is different as shown in FIG. 23B. The difference in length facilitates the use of multiple L-shaped conductive leads 310.

Of course, the lead pusher 1102 may include any number of grooves (e.g., one, two, three or more) to accommodate a corresponding number of leads for insertion. Moreover, the grooves may have various shapes to accommodate different shaped leads. Further, any two or more of the grooves may have differing depths so that inserted leads are staggered with respect to each other, or otherwise form multiple columns. Lead pusher 1102 also includes a recessed portion 1118 that enables the lead pusher 1102 and substrate 250 to move relative to each other as discussed in greater detail later. Lead pusher 1102 may also include large hole 1114 and small hole 1116 through which fasteners (not shown) are inserted to attach the lead pusher 1102 to its movement means.

Figure 24C:
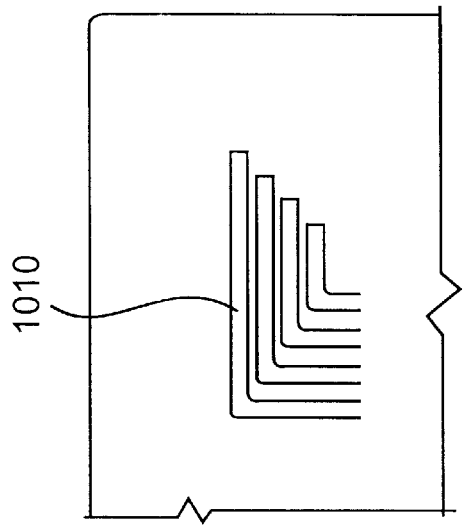
FIGS. 24A–C are side, perspective, and enlarged side views of a die according to the present invention.
Figure 24B:
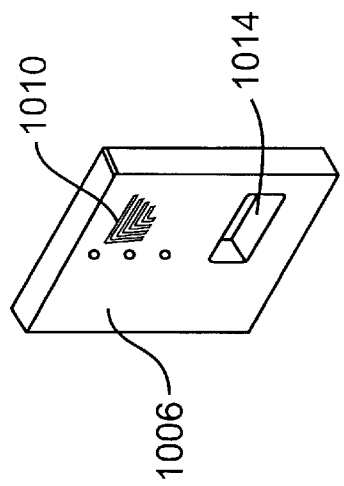
Figure 24A:
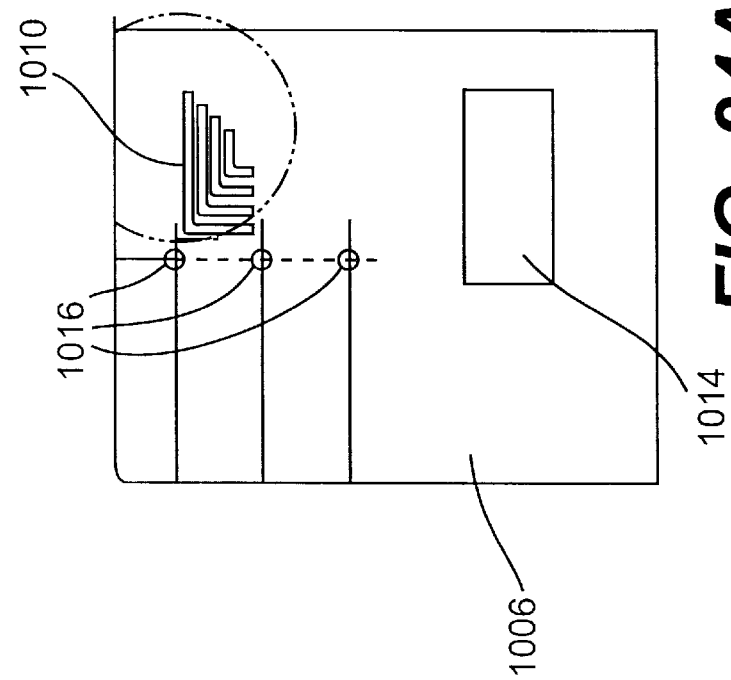

Turning to FIGS. 24A–C, an embodiment of the dies 1006, 1008 are shown. The insertion head assembly 1002 includes dies 1006, 1008 to ensure that the leads 310 are accurately pushed into grooves 1108a, b, c, d on the lead pusher 1102 (see FIG. 25). Since dies 1006 and 1008 are identical, only die 1006 will be discussed in detail for reasons of simplicity. Die 1006 includes multiple alignment holes 1016. Die 1006 also includes slots 1010 and a scrap opening 1014 that pass through the die 1006. The function of scrap opening 1014 will be discussed in detail later.

Figure 26:
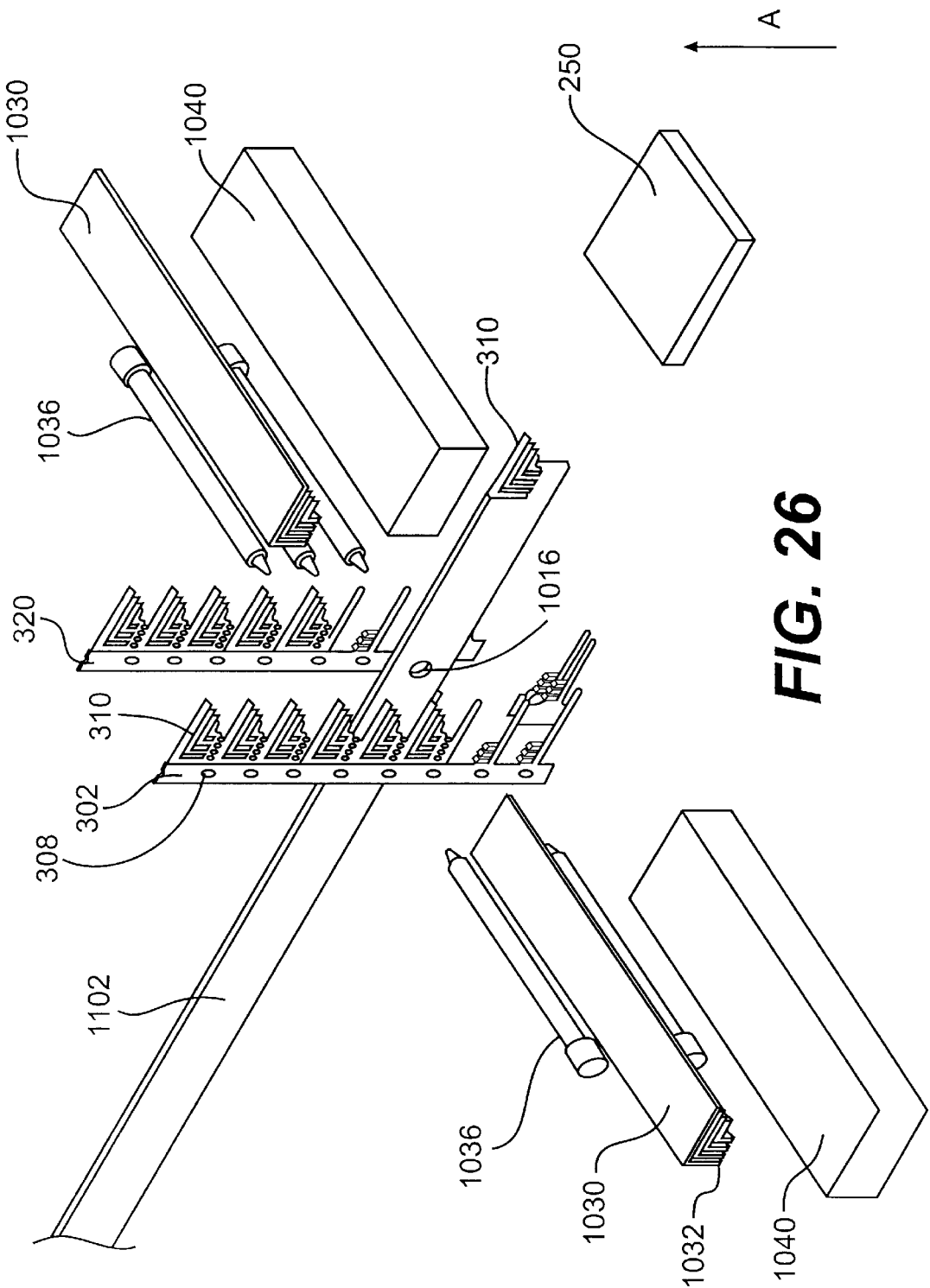
Figure 27:
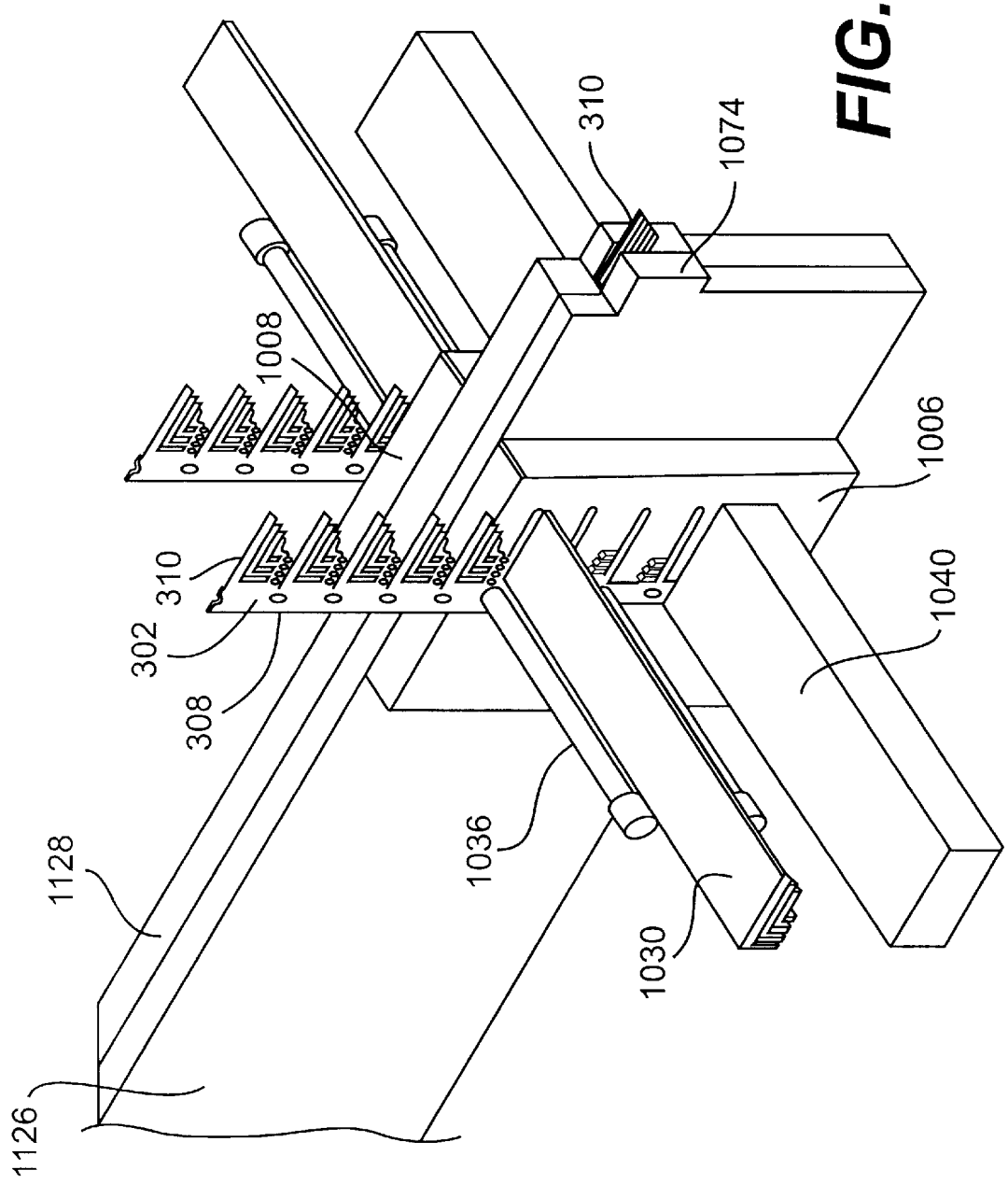

Turning to FIGS. 25–27, the operation of the lead insertion machine in accordance with an embodiment of the invention will be described. FIG. 25 shows an exploded view of some of the components of the lead insertion mechanism 1000. The relative relationship between the punching elements, lead pusher 1102, and the lead supply 300 may be understood.

As previously discussed, the carrier 302 for leads 310 may be split into two portions 302A and 302B by the splitter assembly 900. In FIG. 25, the portions of carrier 302A,B are shown without the corresponding supply column 1070. As a result of the carrier 302 being split, the leads 310 are oriented in the same direction on either side of the lead insertion component 1002.

The carriers 302 are advanced downwardly by rollers in supply column 1070 a distance equivalent to a set of leads 310 with each reciprocation of punching member 1020 and its associated punching elements.

Turning to the punching elements in accordance with an embodiment of the invention, lead punch 1030, scrap punch 1040 and alignment pins 1036 are mounted to a punching member 1020 which reciprocally moves them into and out of engagement with die 1006. The punching elements on the left side of FIG. 25 are moved in the direction of the "B" arrow to engage the carrier 302A while those on the right side of FIG. 25 are moved in the direction of the "C" arrow simultaneously to engage carrier 302B.

Each alignment pin 1036 has a tapered end point that is inserted into an alignment hole 308 in carrier 302A and into hole 1016 in die 1006 as shown in FIG. 27. Alignment pin 1036 ensures that the leads 310 adjacent to a particular alignment hole 308 are aligned with slots 1010 in die 1006. This prevents damage to leads 310 due to misalignment and improves the overall efficiency of the manufacturing process.

In accordance with an embodiment of the invention, lead punch 1030 comprises multiple ribs 1032 that are mounted at one end to the punching member 1020. Ribs 1032 are spaced apart so as to be aligned with the spacing of leads 310 secured to mounting elements 306 of carrier 302A. When the lead punch 1030 is moved into contact with leads 310 on carrier 302 as shown in FIG. 27, leads 310 are separated from the mounting elements 306 and pushed through slots 1010 in die 1006 into corresponding grooves 1108a, b, c, d in lead pusher 1102.

In accordance with an embodiment of the invention, scrap punch 1040 may be a rectangularly shaped block that mates with scrap opening 1014 in die 1006. Scrap punch 1040 cuts off the lower most portion of carrier 302 that is aligned with the scrap opening 1014.

Referring to FIG. 26, the punching elements, pushing elements, and carriers 302 in accordance with an embodiment of the invention are shown without dies 1006, 1008 or plates 1126, 1128. As illustrated in FIG. 26, and as discussed below, after leads 310 have been punched into pusher 1102, the pusher 1102 inserts the leads into substrate 250.

Figure 28:
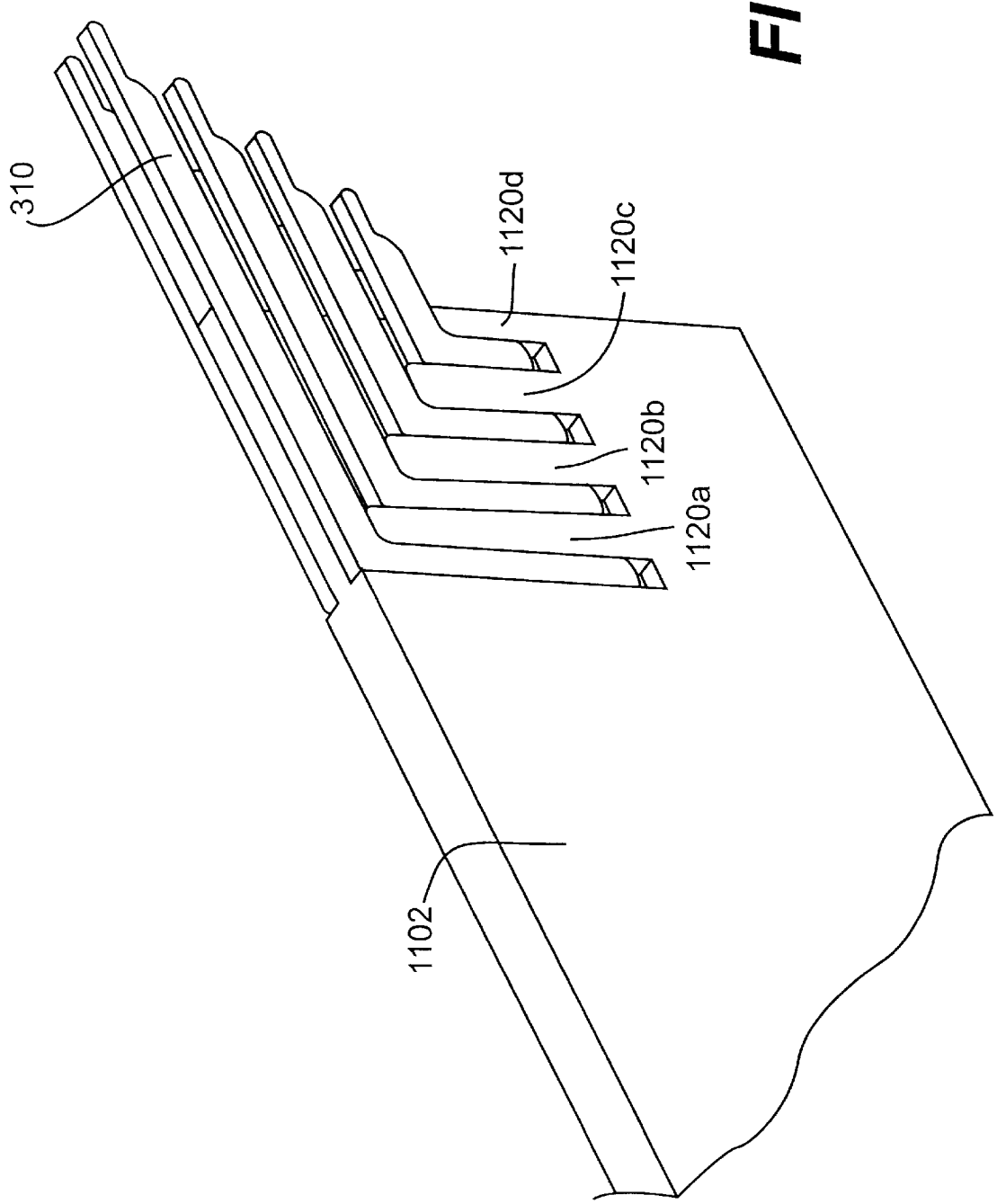
FIG. 28 is a perspective view of a lead pusher with conductive leads located thereon.

As mentioned previously, the lead pusher 1102 of an embodiment of the invention is moved reciprocally inside a tunnel 1130 defined by plates 1126, 1128. Lead pusher 1102 is shown in FIGS. 26 and 28 with conductive leads 310 extending from its inserting end 1106. Referring to FIG. 28, a close-up perspective view of leads 310 in grooves 1108a, b, c, d of lead pusher 1102 shows leads 310 after being punched by lead punch 1030.

Figure 29:
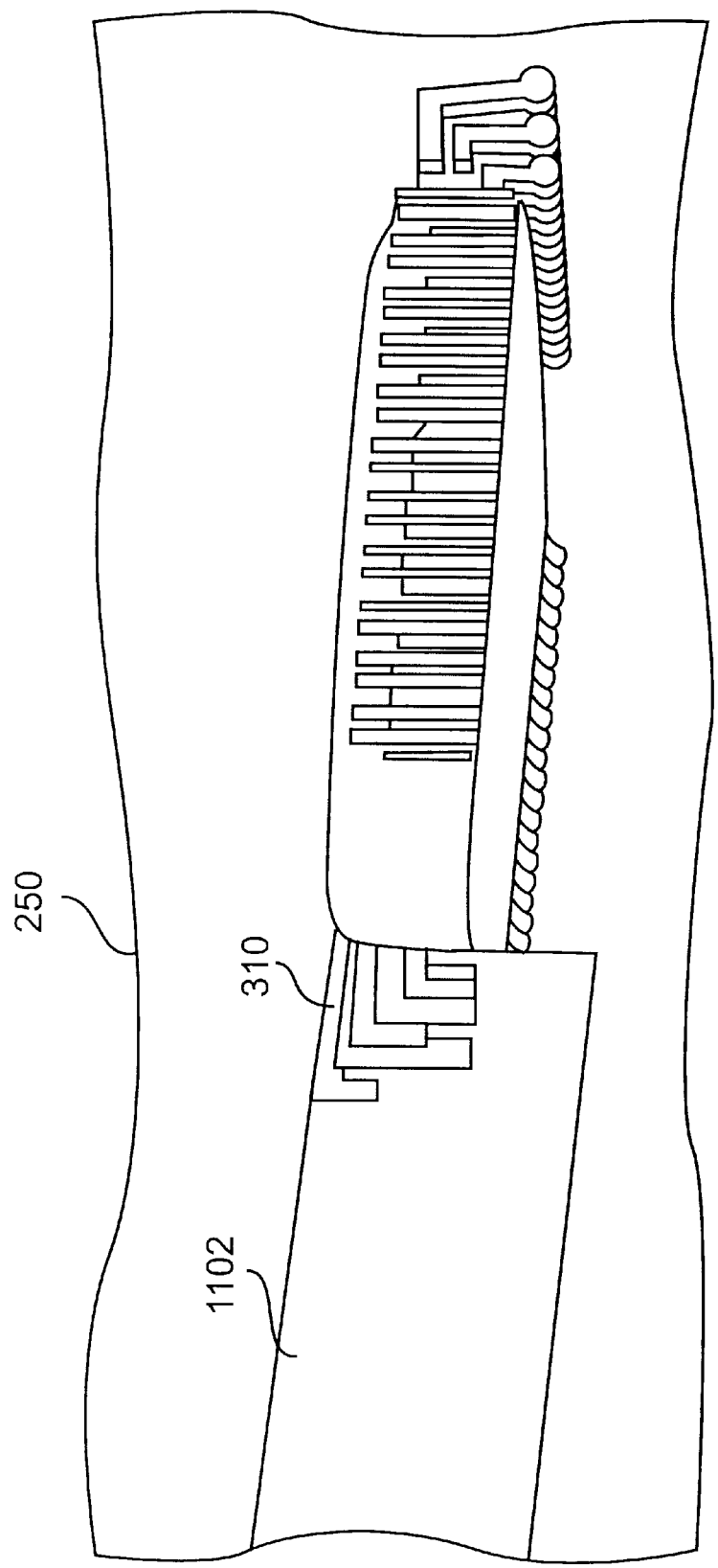
FIGS. 29–30 are side views showing the relative movement between the lead pusher and the substrate.
Figure 30:
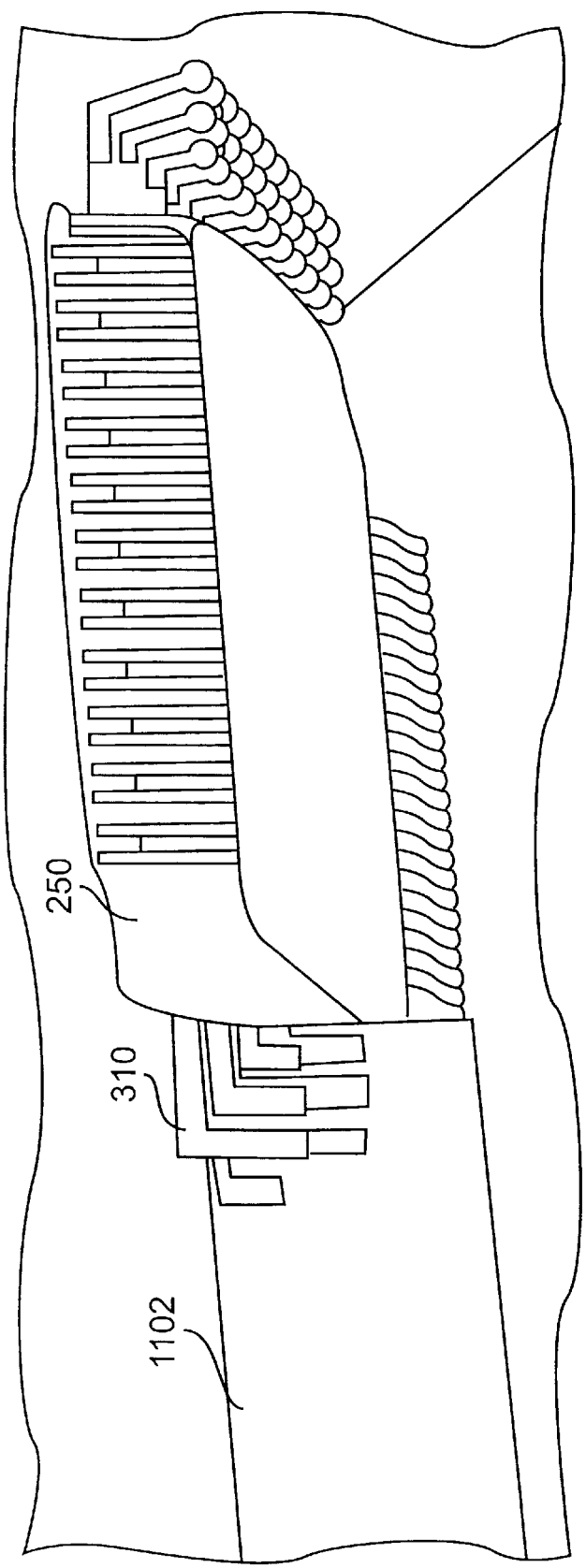

Turning to the insertion of the leads 310 into substrate 250, FIGS. 29 and 30 show the relative movement between the lead pusher 1102 and a substrate 250. Once leads 310 are inserted into lead pusher 1102, lead pusher 1102 moves forward so that leads 310 extend beyond plates 1126 and 1128 as shown in FIGS. 25 and 27. At the same time, leads 310 are inserted into lead passages 254 in the side walls 252 of a substrate 250 that is positioned on support member 500. Once the leads 310 are inserted, the pedestal 510 and substrate 250 are lifted up a distance sufficient to remove the ends of leads 310 from grooves 1108a, b, c, d as shown in FIG. 30. At this point, lead pusher 1102 may be withdrawn into tunnel 1130 and aligned to await the next sets of leads 310. While FIGS. 29 and 30 only show a single side of lead pusher 1102, the procedure described immediately above applies to the leads 310 on the side of the lead pusher 1102 that is not shown. Thus, in the illustrated embodiment, six leads are inserted during each stroke of pusher 1102 (three on each side of pusher 1102).

Once lead pusher 1102 has been withdrawn, substrate moving assembly 400 advances support member 500 so that the next empty lead passages 254 in substrate 250 are aligned with lead pusher 1102. The above described lead inserting process is repeated for the next sets of leads 310. In other words, carriers 302 are advanced to position the next set of leads 310 for punching adjacent the slots 1010 in die 1006, and lead punch 1030, scrap punch 1040, alignment pins 1036 are moved to engage their corresponding portions of the carrier 302.

When all the lead passages 254 along the side walls 252 of substrate 250 are filled, pedestal 510 is lifted upward and rotated 90 degrees so that leads 310 may be inserted into lead passages 254 in the remaining two side walls 252. The lead inserting processes above are repeated until all of the lead passages 254 of the substrate 250 are filled. Note that although the preferred embodiment of the invention includes two insertion mechanisms 1002 and 1004 operating on opposing sides of the substrate 250, the invention also encompasses an alternate embodiment where four insertion mechanisms are utilized to simultaneously operate on all sides of the substrate.

Figure 31:
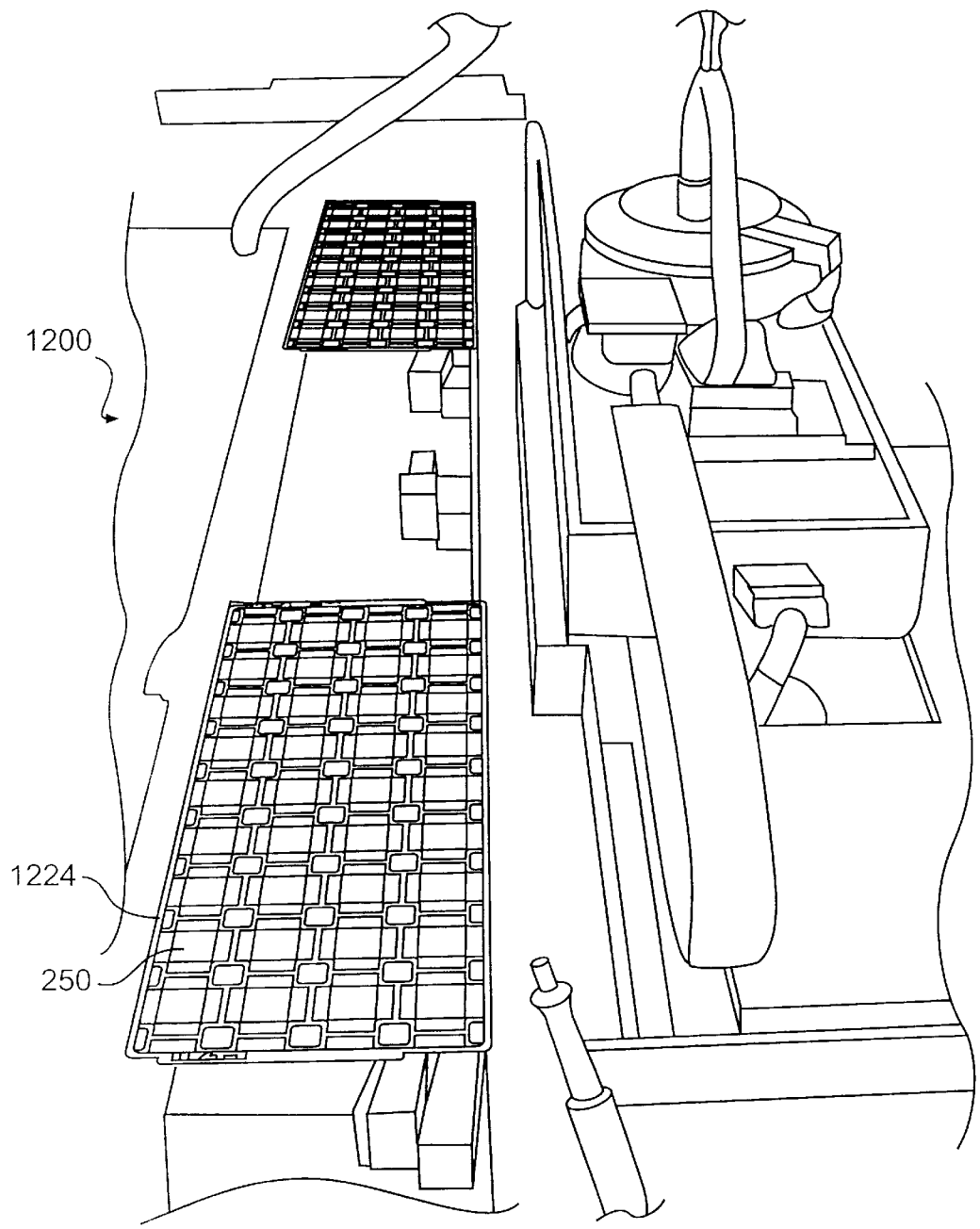
FIGS. 31 and 32 are perspective and exploded isometric views of the conveyor assembly according to the present invention.
Figure 33A:
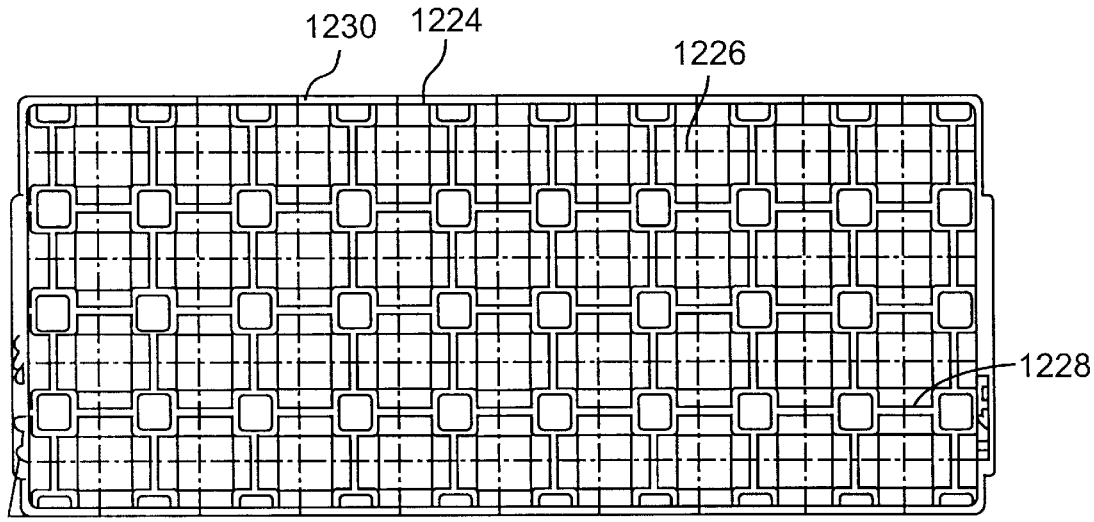
FIGS. 33A–C are top, side, and bottom views of the product carriage according to the present invention.
Figure 33B:
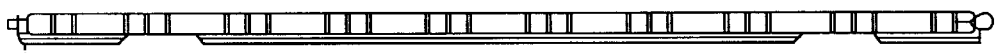
Figure 33C:
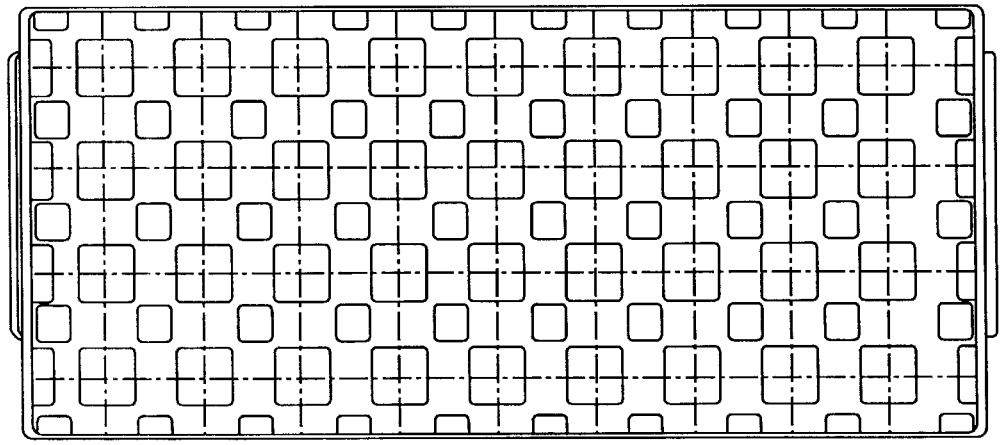
Figure 34:
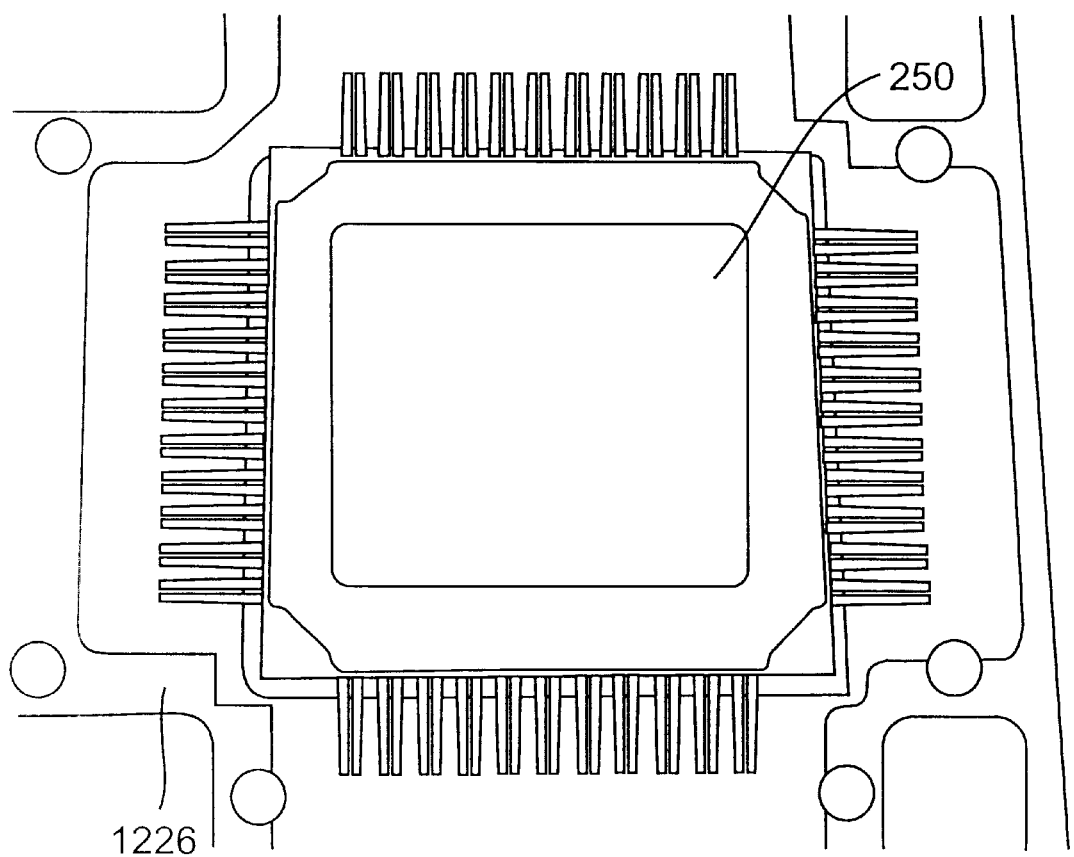
FIG. 34 is a finished substrate located on the product carriage of FIGS. 33A–C.

Now the procedure for handling the finished substrates 250 will be discussed in reference to FIGS. 31–34. Referring to FIG. 31, the conveyor assembly 1200 that holds finished substrates 250 is shown. The preferred embodiment of the conveyor assembly 1200 includes product carriages 1224 that are mounted on conveyor rails 1202. As shown in FIGS. 33A–C, each product carriage 1224 may include pockets 1226 that are defined by walls 1228. Finished substrates 250 may be removed from the support member 500 and placed into pockets 1226 on product carriage 1224 by robot assembly 600.

Preferably, product carriages 1224 are moved along conveyor rails 1202 by an endless belt design (not shown) that is driven a motor 1222 (see FIG. 32). The movement of product carriages 1224 is limited by stop assemblies 1218, 1220 (see FIG. 32). Initially, an empty product carriage 1224 is moved to an insertion area where it contacts a stop assembly 1218. During the manufacturing process, finished substrates 250 are inserted into pockets 1226 in a product carriage 1224. Once the product carriage 1224 is full, it is moved to a pick-up position from which the product carriage can be taken out of the lead insertion machine 10. The conveyor assembly 1200 also allows for a minimal manual adjustment of the product carriage 1224.

Referring to FIG. 32, the various parts of the conveyor assembly 1200 in accordance with an embodiment of the invention are shown. Conveyor rails 1202 have holes 1206 formed therethrough. On the outside of each rail 1202 is a spacer 1204 with holes 1208 for fasteners to be inserted. At each end of the rails 1202 is an upper plate 1210 and lower plate 1214. The upper plate 1210 has a mounting hole 1240 for receiving a fastener inserted through hole 1206 of rail 1202.

An embodiment of the product carriage 1224 is shown in FIG. 33. Product carriage 1224 includes an outer wall 1230 and pockets 1226 defined by walls 1228. A finished substrate 250 is shown in a pocket 1226 in FIG. 34.

Figure 36:
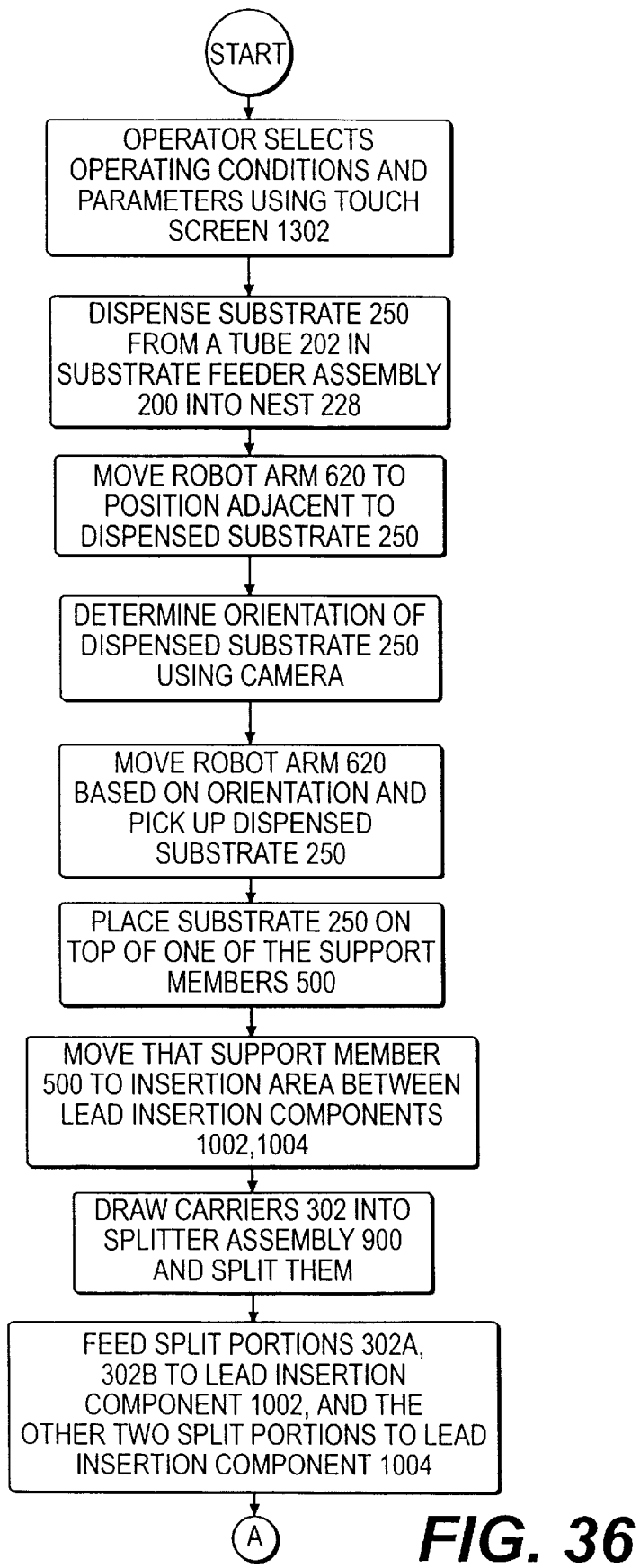
FIG. 36 is a flow diagram illustrating the operation of the lead insertion machine according to the present invention
Figure 36:
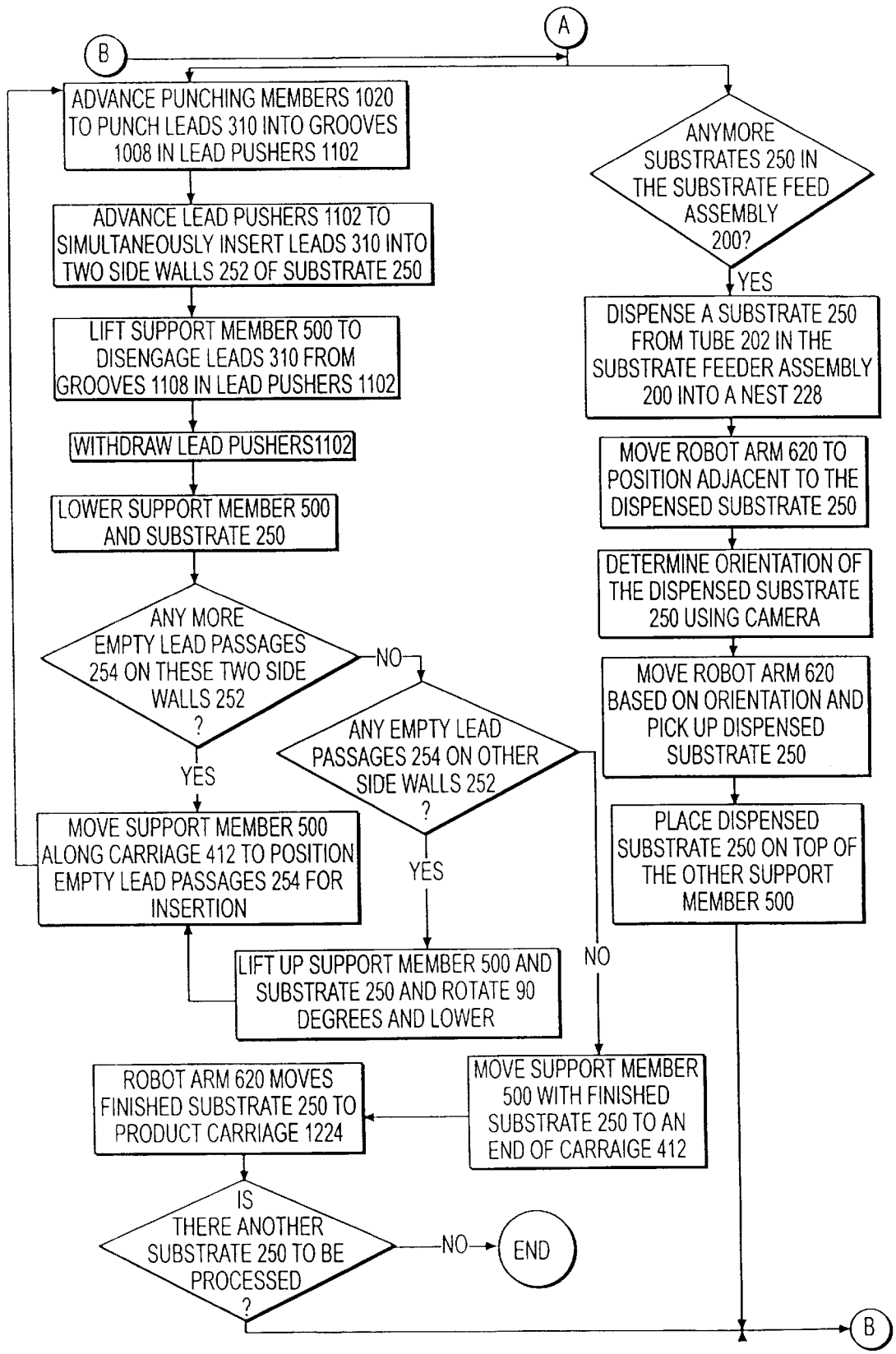

The lead insertion process in accordance with an embodiment of the invention will be described in detail below. This process is shown schematically in the flow chart of FIG. 36.

Initially, the tubes 202 are placed into the substrate feeder assembly 200. Reels 802, 804, with a lead supply line 300 wound thereon, are placed onto the upper frame 842 of the dereeler assembly 800. The interleaf 312 is pulled out and strung to the take-up reel 808 where it is clamped by clamp. The scrap bin 118 is emptied, if necessary, and doors 106, 108 and shields are closed.

The operator goes to the touch screen 1302 of the software control assembly and selects the set-up menu. After selecting the operating conditions, including the type of product (i.e. size of the package and number of leads), on the set-up menu, the operator uses the run menu to finalize the conditions for the process.

Next, the conveyor assembly 1200 advances the product carriage 1224 to the insertion area. After a substrate 250 is dispensed from a tube 202, the robot assembly 600 moves to the pick-up location adjacent the substrate 250. The camera on the end of the robot arm 620 looks at the substrate 250 and sends back the image of the substrate 250 to the control system to determine its orientation. Based on the orientation, the robot arm 620 is adjusted and lowered to engage the substrate 250. The end effector 650 picks up the substrate 250 and places it on a support member 500. The support member 500 is then moved to the insertion area between the lead insertion components 1002, 1004.

Next, the portion of the carrier 302 that corresponds to the unwound interleaf 312 is fed into the splitter assembly 900. The carrier 302 is split and advanced to the lead insertion components 1002, 1004 which pulls the carriers 302 and locates the leads 310 for punching.

After properly locating the leads 310, the punching members 1020 are moved to punch the leads 310 into lead pusher 1102. Lead pusher 1102 is advanced to insert the leads 310 into the substrate 250, the substrate is raised in the vertical direction, and the pusher 1102 is then retracted. Accordingly, two columns of leads on each side of the package are inserted. The support member 500 is advanced along carriage 412 to align the next empty passages 254 on the side walls 252 with the leads 310 to be inserted. When those side walls 252 are filled, the support member 500 and substrate 250 are lifted up and rotated 90 degrees. The process of inserting leads 310 and advancing the support member 500 is repeated until the passages 254 on all four side walls 252 are filled. When the lead insertion of the leads into the substrate 250 is finished, the support member 500 is moved to an unload location, where the robot assembly 600 picks up the substrate 250 and places in onto product carriage 1224.

While the above described process is running, the robot assembly 600 is loading another substrate 250 onto the other support member 500. This eliminates any down time of the lead insertion machine 10. Also as discussed earlier, while a completed substrate is moved to the product carriage 1224, leads are being inserted into another substrate.

The number of conductive leads that are simultaneously inserted into the substrate may be varied so long as the lead pusher has a sufficient number of corresponding grooves. Conductive leads may be inserted into all or some of the rows of passages on each side of the substrate at a given time. Further, the conductive leads may have different lengths to correspond to their locations in tiers on the side walls of the substrate. Additionally, the invention can be used with two or four lead insertion components. The number of lead passages in the substrate can vary depending on the quantity of leads to be inserted. Further, depending on the design of the carrier, leads may be inserted into passages in only one of the side walls of the substrate, or only two of the side walls, or any number of side walls.

It will be apparent to those skilled in the art that various modifications and variations can be made without departing from the scope or spirit of the invention. Other embodiments of the invention will be apparent to those skilled in the art from consideration of the specification and practice of the invention disclosed herein. For example, the lead insertion machine may be operated in whole or in part by hydraulic components. Further, the fact that the lead insertion machine may include a varying number of tubes to hold the substrates, leads to be inserted, and arrangements of components of the lead insertion machine is intended to be within the scope of the invention. A further embodiment of the lead insertion machine contemplates vertical movement of the lead pusher with respect to the pedestal and substrate once leads have been inserted. In other words, instead of lifting up the pedestal to remove the leads from the grooves in the lead pusher, the lead pusher is lifted. The shape of the lead pusher may be varied to push leads into any arrangement of lead passages on side walls of a substrate. It is intended that the specification and examples be considered as exemplary only, with a true scope and spirit of the invention being indicated by the following claims.

We claim:

1. A method of manufacturing a semiconductor die carrier including a substrate having a plurality of side walls, comprising the step of:

simultaneously inserting at least one conductive lead into a lead passage through one of the side walls of the substrate for retention therein and at least one conductive lead into a lead passage through another of the side walls of the substrate for retention therein.

2. The method of manufacturing a semiconductor die carrier according to claim 1, wherein the step of simultaneously inserting at least one conductive lead further comprises:

simultaneously inserting a column of conductive leads into lead passages through one of the side walls of the substrate for retention therein and another column of conductive leads into lead passages through another one of the side walls of the substrate for retention therein.

3. The method of manufacturing a semiconductor die carrier according to claim 2, wherein the conductive leads in each column are of differing length.

4. The method of manufacturing a semiconductor die carrier according to claim 1, wherein the step of simultaneously inserting at least one conductive lead comprises:

holding the at least one conductive lead in a substantially L-shaped groove of a lead pusher; and extending said lead pusher to insert the at least one conductive lead into the lead passage through the side wall of the substrate.

5. The method of manufacturing a semiconductor die carrier according to claim 4, wherein the step of simultaneously inserting at least one conductive lead comprises moving the lead pusher in an orthogonal direction to release the at least one conductive lead from the groove of the lead pusher.

6. The method of manufacturing a semiconductor die carrier according to claim 4, wherein the step of simultaneously inserting at least one conductive lead comprises moving the substrate to release the at least one lead from the groove of said lead pusher.

7. The method of manufacturing a semiconductor die carrier according to claim 6, further comprising the step of moving the substrate to align empty lead passages on the side walls of the substrate with the lead pusher.

8. The method of manufacturing a semiconductor die carrier according to claim 7, further comprising the rotating the substrate to permit the insertion of leads into another side of the substrate.

9. The method of manufacturing a semiconductor die carrier according to claim 1, wherein the step of simultaneously inserting at least one conductive lead further comprises supplying conductive leads in a strip.

10. The method of manufacturing a semiconductor die carrier according to claim 9, wherein the step of simultaneously inserting at least one conductive lead further comprises advancing a punch to separate the conductive leads from the strip and to insert the leads into grooves of a lead pusher.

11. The method of manufacturing a semiconductor die carrier according to claim 1, wherein the step of simultaneously inserting further comprises:

supplying conductive leads in strips; and advancing a punch on each side of the lead pusher to separate the conductive leads from the strips and to insert the leads into grooves on opposite sides of the lead pusher.

12. The method of manufacturing a semiconductor die carrier according to claim 1, wherein the step of simultaneously inserting at least one conductive lead further comprises:

simultaneously inserting multiple columns of conductive leads into lead passages of one of the side walls for retention therein and multiple columns of conductive leads into lead passages of another one of the side walls for retention therein.

13. A method of manufacturing a semiconductor die carrier including a substrate having a plurality of side walls, comprising the step of:

holding a conductive lead in a substantially L-shaped groove of a lead pusher; and extending said lead pusher to insert said conductive lead into a lead passage on side wall of the substrate.

14. The method of manufacturing a semiconductor die carrier according to claim 13, further comprising the step of moving the substrate to release said conductive lead from the groove of said lead pusher.

15. The method of manufacturing a semiconductor die carrier according to claim 13, further comprising the step of moving said lead pusher in a substantially orthogonal direction to release said conductive lead from the groove of said lead pusher.

16. The method of manufacturing a semiconductor die carrier according to claim 13, further comprising the step of moving the substrate to align empty lead passages on the side walls of the substrate with the lead pusher.

17. The method of manufacturing a semiconductor die carrier according to claim 13, further comprising the step of rotating the substrate to permit the insertion of leads into another side of the substrate.

18. The method of manufacturing a semiconductor die carrier according to claim 13, further comprising the step of supplying the conductive leads in a strip for insertion into the L-shaped groove of the lead pusher.

19. The method of manufacturing a semiconductor die carrier according to claim 18, wherein the step of supplying comprises advancing a punch to separate at least one conductive lead from the strip and to insert the lead into the groove of the lead pusher.

20. The method of manufacturing a semiconductor die carrier according to claim 18, wherein said lead pusher includes multiple substantially L-shaped grooves, each groove for holding a conductive lead for insertion into the substrate.

21. The method of manufacturing a semiconductor die carrier according to claim 20, wherein the step of supplying comprises advancing a punch to separate multiple conductive leads from the strip and to insert the leads into the grooves of the lead pusher.

22. The method of manufacturing a semiconductor die carrier according to claim 20, wherein the step of supplying comprises:

supplying the conductive leads in multiple strips; and advancing a punch on each side of the lead pusher to separate the conductive leads from the strips and to insert the leads into the grooves of the lead pusher.

23. The method of manufacturing a semiconductor die carrier according to claim 18, wherein said lead pusher includes multiple substantially L-shaped grooves on a first side of the pusher and multiple substantially L-shaped grooves on a second side of the pusher opposite the first side, each groove for holding a conductive lead for insertion into the substrate.

24. The method of manufacturing a semiconductor die carrier according to claim 23 wherein the step of supplying comprises:

supplying the conductive leads in multiple strips; and advancing a punch on each side of the lead pusher to separate the conductive leads from the strips and to insert the leads into the grooves of the lead pusher.

25. The method of manufacturing a semiconductor die carrier according to claim 13, wherein the step of holding comprises holding multiple conductive leads with said lead pusher and said step of extending comprises extending said lead pusher to insert said multiple conductive leads in a column of lead passages through one of the side walls.

26. The method of manufacturing a semiconductor die carrier according to claim 25, wherein the step of extending comprises extending said lead pusher to insert said multiple conductive leads in multiple columns of lead passages through one of the side walls.

27. The method of manufacturing a semiconductor die carrier according to claim 13, further comprising the steps of:

holding a conductive lead in a substantially L-shaped groove of a further lead pusher; and extending said further lead pusher to insert the conductive lead into a lead passage through another side wall of the substrate.

28. The method of manufacturing a semiconductor die carrier according to claim 27, wherein the step of extending said lead pusher and said step of extending said further lead pusher are performed simultaneously.

29. The method of manufacturing a semiconductor die carrier according to claim 28, wherein each of said lead pusher and said further lead pusher hold multiple conductive leads and said steps of extending said lead pusher comprises extending said lead pusher to insert multiple conductive leads into lead passages through a side wall of the substrate, and said step of extending said further lead pusher comprises extending said further lead pusher to insert multiple conductive leads into lead passages through another side wall of the substrate.

* * * * *